(12) United States Patent
Dolny et al.

(10) Patent No.: US 7,755,137 B2
(45) Date of Patent: Jul. 13, 2010

(54) BANDGAP ENGINEERED MOS-GATED POWER TRANSISTORS

(75) Inventors: Gary Dolny, Mountain Top, PA (US); Qi Wang, Sandy, UT (US)

(73) Assignee: Fairchild Semiconductor Corporation, So. Portland, ME (US)

( * ) Notice: Subject to any disclaimer, the term of this patent is extended or adjusted under 35 U.S.C. 154(b) by 0 days.

(21) Appl. No.: 11/245,995

(22) Filed: Oct. 7, 2005

(65) Prior Publication Data
US 2006/0118863 A1 Jun. 8, 2006

Related U.S. Application Data

(60) Provisional application No. 60/617,167, filed on Oct. 7, 2004, provisional application No. 60/617,464, filed on Oct. 7, 2004, provisional application No. 60/617,463, filed on Oct. 7, 2004, provisional application No. 60/617,168, filed on Oct. 7, 2004.

(51) Int. Cl.
H01L 29/76 (2006.01)

(52) U.S. Cl. ............... 257/330; 257/192; 257/328; 257/329; 257/331; 257/412; 257/19; 257/67; 257/408

(58) Field of Classification Search ............ 257/192, 257/330, 331, 412, 19, 67, 328, 408, 329
See application file for complete search history.

(56) References Cited

U.S. PATENT DOCUMENTS 5,451,800 A * 9/1995 Mohammad ............ 257/191
5,534,713 A 7/1996 Ismail et al.

(Continued)

FOREIGN PATENT DOCUMENTS

WO    WO 2006/042040 A2    4/2006

(Continued)

OTHER PUBLICATIONS

International Preliminary Report on Patentability for International Application No. PCT/US2005/036036, dated Apr. 11, 2007, 4 pages total.

(Continued)

*Primary Examiner*—Cuong Q Nguyen
*Assistant Examiner*—Trang Q Tran
(74) *Attorney, Agent, or Firm*—Townsend and Townsend and Crew LLP

(57) ABSTRACT

Devices, methods, and processes that improve immunity to transient voltages and reduce parasitic impedances. Immunity to unclamped inductive switching events is improved. For example, a trench-gated power MOSFET device having a SiGe source is provided, where the SiGe source reduces parasitic npn transistor gain by reducing hole current in the body or well region, thereby decreasing the likelihood of a latch-up condition. A body tie on this device can also be eliminated to reduce transistor cell size. A trench-gated power MOSFET device having a SiGe body or well region is also provided. A SiGe body reduces hole current when the body diode is turned on, thereby reducing reverse recovery power losses. Device characteristics are also improved. For example, parasitic gate impedance is reduced through the use of a poly SiGe gate, and channel resistance is reduced through the use of a SiGe layer near the device's gate.

20 Claims, 21 Drawing Sheets

U.S. PATENT DOCUMENTS

| | | |
|---|---|---|
| 6,020,600 A | 2/2000 | Miyjima et al. |
| 6,200,866 B1 | 3/2001 | Ma et al. |
| 6,255,692 B1* | 7/2001 | Huang ................ 257/341 |
| 6,274,905 B1* | 8/2001 | Mo ..................... 257/330 |
| 6,350,993 B1 | 2/2002 | Chu et al. |
| 6,373,112 B1 | 4/2002 | Murthy et al. |
| 6,531,748 B2 | 3/2003 | Pfirsch |
| 6,700,180 B2 | 3/2004 | Huang |
| 6,709,912 B1* | 3/2004 | Ang et al. ............ 438/199 |
| 6,885,084 B2 | 4/2005 | Murthy |
| 6,887,760 B2 | 5/2005 | Curro et al. |
| 7,504,691 B2 | 3/2009 | Park et al. |
| 2003/0146428 A1 | 8/2003 | Ma et al. |
| 2003/0227072 A1* | 12/2003 | Forbes et al. ......... 257/616 |
| 2004/0180485 A1 | 9/2004 | Beasom |
| 2004/0256639 A1 | 12/2004 | Ouyang et al. |
| 2005/0035400 A1 | 2/2005 | Shirai et al. |
| 2005/0116217 A1* | 6/2005 | Jones et al. ............ 257/19 |
| 2007/0108513 A1 | 5/2007 | Rub et al. |

FOREIGN PATENT DOCUMENTS

| | | |
|---|---|---|
| WO | WO 2008/027722 A2 | 3/2008 |

OTHER PUBLICATIONS

Office Action of Chinese Application No. 200580034226.2, dated Jun. 27, 2008, 8 pages total.

Ahoujja et al., "Electrical properties of boron-doped p—SiGeC grown on n—Si substrate," *Applied Physics Letters*, 77(9):1327-1329 (Aug. 28, 2000).

Baliga, B. J., *Power Semiconductor Devices*, 3rd Edition, cover page and pp. 362-367 (1996).

Bouillon et al., "Search for the optimal channel architecture for 0.18/0.12 μm bulk CMOS Experimental study," *IDEM Tech. Digest*, 96:559-562 (1996).

Chang et al., "Suppression of boron penetration by polycrystalline $Si_{1-x-y}Ge_xC_y$ in metal-oxide-semiconductor structures," *Applied Physics Letters*, 74(17):2501-2503 (Apr. 26, 1999).

Fischetti et al., "Band structure, deformation potentials, and carrier mobility in strained Si, Ge, and SiGe alloys," *J. Appl. Phys.*, 80(4):2234-2252 (Aug. 15, 1996).

Huang et al., "Effect of polysilicon depletion on MOSFET I-V characteristics," *Electronics Letters*, 29(13):1208-1209 (Jun. 24, 1993).

International Search Report of Feb. 25, 2008 in international application PCT/US07/75911.

International Search Report of Jan. 3, 2007 in international application PCT/US05/036036.

King et al., "Electrical Properties of Heavily Doped Polycrystalline Silicon-Germanium Films," *IEEE Transactions on Electron Devices*, 41(2):228-232 (Feb. 1994).

Lang et al., "Measurement of the band cap of $Ge_xSi_{1-x}$/Si strained-layer heterostructures," *Appl. Phys. Lett.*, 47(12):1333-1335 (Dec. 15, 1985).

Langdo et al., "SiGe-free strained Si on insulator by wafer bonding and layer transfer," *Applied Physics Letters*, 82(24):4256-4258 (Jun. 16, 2003).

Lee et al., "Observation of Reduced Boron Penetration and Gate Depletion for Poly-$Si_{0.8}Ge_{0.2}$ Gated PMOS Devices," *IEEE Electron Device Letters*, 20(1):9-11 (Jan. 1999).

Leitz et al., "Hole mobility enhancements in strained $Si/Si_{1-y}Ge_y$ p-type metal-oxide-semiconductor field-effect transistors grown on relaxed $Si_{1-x}Ge_x$(x<y) virtual substrates," *Applied Physics Letters*, 79(25):4246-4248 (Dec. 17, 2001).

Li et al., "Carrier velocity-field characteristics and alloy scattering potential in $Si_{1-x}Ge_x/Si$," *Appl. Phys. Lett.*, 63(10):1393-1395 (Sep. 6, 2003).

Non Final Office Action mailed Mar. 17, 2008 in U.S. Appl. No. 11/469,456.

Ricco et al., "Characterization of Polysilicon-Gate Depletion in MOS Structures," *IEEE Electron Device Letters*, 17(3):103-105 (Mar. 1996).

Stewart et al., "Suppression of Boron Penetration in P-Channel MOSFETs Using Polycrystalline $Si_{1-x-y}Ge_xC_y$ Gate Layers," *IEEE Electron Device Letters*, 22(12):574-576 (Dec. 21, 2001).

Sun et al., "Electron Mobility in Inversion and Accumulation Layers on Thermally Oxidized Silicon Surfaces," *IEEE Trans. Electron Devices*, vol. ED-27, 12 pages (1980).

Sze, eds., cover page, table of contents and pp. 160-163 from *Modern Semiconductor Device Physics*, John Wiley & Sons (1998).

Terauchi et al., "Suppression of the Floating-Body Effects in SOI MOSFETs by Bandgap Engineering," *1995 Symp. VLSI Tech. Digest of Technical Papers*, pp. 35-36 (1995).

"The Profiling of Polycrystalline Silicon," 2 pages, Solecon Labs Technical Note. Jun. 1, 2002.

Van De Walle et al., "Theoretical calculations of heterojunction discontinuities in the Si/Ge system," *Physical Review B*, 34(8):5621-5634 (Oct. 15, 1988).

Written Opinion of Jan. 3, 2007 in international application PCT/US05/036036.

Written Opinion of Feb. 25, 2008 in international application PCT/US07/75911.

Non-Final Office Action for U.S. Appl. No. 11/469,456, mailed on Mar. 17, 2008, 14 pages.

Notice of Allowance for U.S. Appl. No. 11/469,456, mailed on Oct. 15, 2008, 12 pages.

Notice of Allowance for U.S. Appl. No. 11/469,456, mailed on Jan. 12, 2009, 10 pages.

International Preliminary Report on Patentability for International Application No. PCT/US2007/075911, mailed on Mar. 12, 2009, 8 pages.

Chinese Office Action for Application No. CN200580034226.2, Dated Oct. 16, 2009, 9 pages.

"The Profiling of Polycrystalline Silicon," 4 pages, at URL: http://web.archive.org/web/20030310075958/www.solecon.com/pdf/profiling_poly.pdf, available as early as Jun. 1, 2002, Solecon Labs Technical Note.

* cited by examiner $$R_{ch} = \frac{L}{Z\mu_p C_{ox}(V_g - V_T)}$$

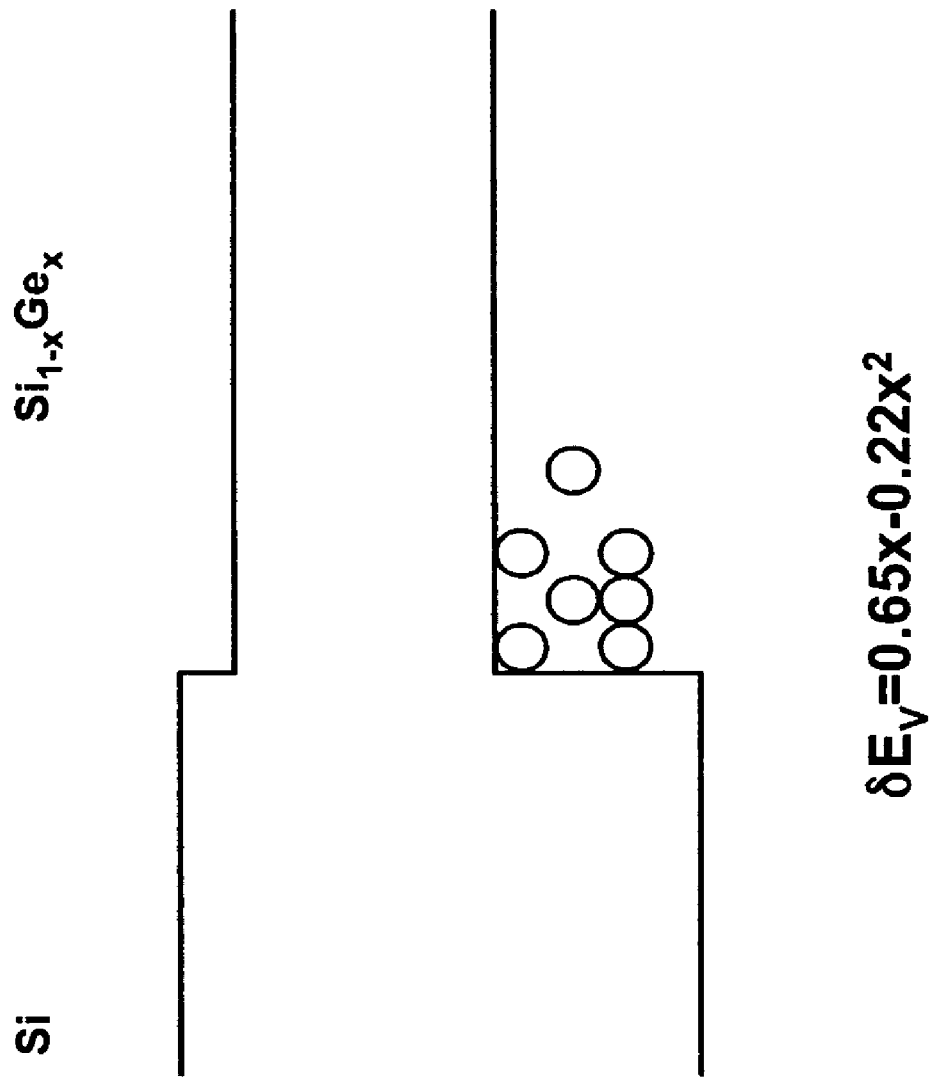

BANDGAP ENGINEERED MOS-GATED POWER TRANSISTORS

This application claims the benefit of U.S. provisional application Nos. 60/617,167, 60/617,464, 60/617,463, and 60/617,168, each filed Oct. 7, 2004, each of which is incorporated by reference.

BACKGROUND

The present invention relates generally to power transistors, and more specifically to metal-oxide-semiconductor-gated (MOS-gated) power transistors with silicon-germanium (SiGe) sources, wells, channels, poly silicon-germanium gates, or a combination thereof.

Trench-gated power MOSFET devices are popular choices for use in several demanding applications, such as DC-to-DC converters. These applications can be very harsh, putting a tremendous strain on these transistors. For example, sourcing and sinking large currents into an inductive load can result in large voltage transients at one or more of the device's terminals. Specifically, a large voltage excursion seen by a trench-gated power MOSFET can activate a parasitic npn transistor, leading to a destructive failure. A less catastrophic, but still performance-degrading event, can occur when a large transient forward-biases a device's body diode, slowing the transistor's reverse recovery.

These inductive effects can limit the efficiency of a DC-to-DC converter, thereby wasting power. Other limits on efficiency include the physical limitations of the trench-gated power MOSFETs themselves. For example, parasitic impedances can cause power dissipation and heating of the devices. Among these parasitic impedances is the series resistance of the gates of the devices. While this series resistance can be mitigated using silicide, the efficacy of this procedure is limited due to the physical structure of these transistors. Channel resistance, or Ron, also limits device performance, thus limiting converter efficiency. Larger devices can reduce Ron, but this results in a more costly device.

Accordingly, what is needed are devices, methods, and processes that provide transistors having improved immunity to the effects of large transient voltages and that provide improved performance by reducing parasitic impedances.

SUMMARY

Accordingly, embodiments of the present invention provide devices, methods, and processes that improve immunity to transient voltages and reduce parasitic impedances.

Embodiments of the present invention provide transistors having improved immunity to unclamped inductive switching and other transient voltage events. For example, an exemplary embodiment of the present invention provides a trench-gated power MOSFET device having a SiGe source. A SiGe source reduces the gain of a parasitic npn transistor by reducing hole current in the body or well region, thereby decreasing the likelihood of a latch-up condition following an unclamped inductive switching event. The body tie on this device can also be eliminated in order to reduce transistor cell size.

Another exemplary embodiment of the present invention provides a trench-gated power MOSFET device having a SiGe body or well region. A SiGe body reduces hole current when the body diode is turned on, thereby reducing the power lost during its reverse recovery.

Embodiments of the present invention may also improve device characteristics. For example, an exemplary embodiment of the present invention reduces parasitic gate impedance by incorporating a poly SiGe gate. Another embodiment provides a channel having reduced channel resistance through the use of a SiGe layer near the device's gate.

Improvements that boost immunity to voltage transients and those that enhance device performance are not exclusive. For example, the use of a SiGe body decreases channel impedance, while a SiGe layer in the body region improves body diode reverse recovery. These embodiments may be used to improve n-channel or p-channel devices. Embodiments of the present invention may incorporate one of more of these or the other features described herein.

BRIEF DESCRIPTION OF THE DRAWINGS

FIG. 18 illustrates a valence band offset for a p-channel trench-gate power MOSFET having a SiGe channel region according to an embodiment of the present invention;

DESCRIPTION OF EXEMPLARY EMBODIMENTS

Figure 1:
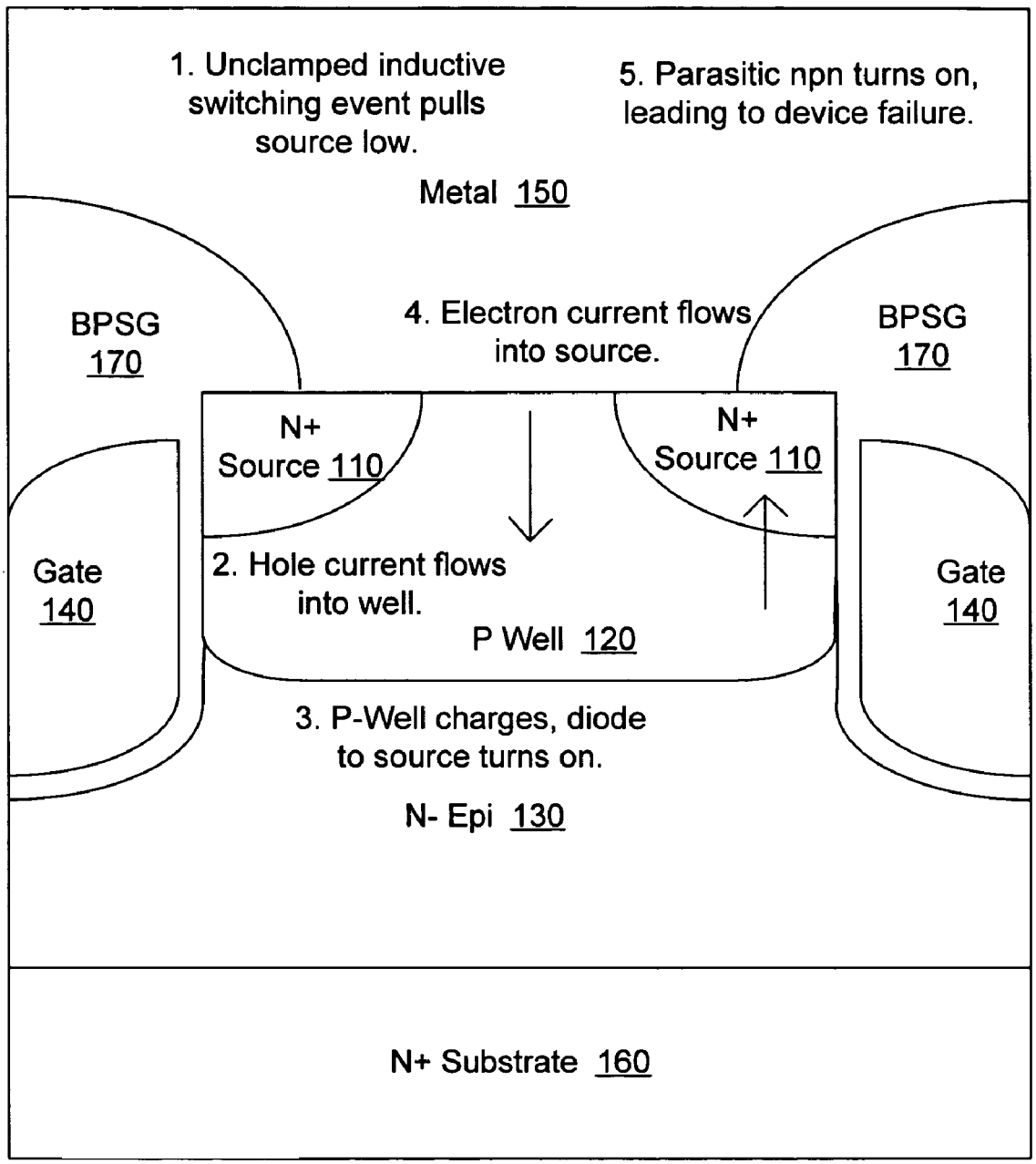
FIG. 1 is a cross section of an n-channel trench-gate power MOSFET that is improved by the incorporation of an embodiment of the present invention.

FIG. 1 is a cross section of an n-channel trench-gate power MOSFET that is improved by the incorporation of an embodiment of the present invention. This device includes n-type source regions 110, a body formed by p-well 120, n-type drain region 130, substrate 160, gates 140, and metal contact 150.

A parasitic npn bipolar transistor is inherent in this structure. Specifically, the parasitic device's emitter is the source region 110, its base is the body or well region 120, while the parasitic device's collector corresponds to the epi region 130. Destructive failure can occur if this parasitic transistor is biased into its forward active mode of operation. This can occur, for example, during avalanche breakdown induced by an unclamped inductive switching (UIS) event. Holes generated by impact ionization can flow through the base formed by the P-Well 120 causing an ohmic voltage drop. If this voltage drop exceeds about 0.6V, the turn-on voltage for the well-to-source junction diode can become forward biased and inject electrons over the potential barrier, thus initiating forward active operation and potential failure.

Specifically, as shown in FIG. 1, an unclamped inductive switching event can pull the source low (1). This causes holes to flow into the body or well 120 (2). The well charges up, or increases in voltage compared to the source 110, turning on the p-well 120 to source 110 junction (3). The result is electron current to flow into the source 110 (4). This causes the parasitic npn to turn on (5), which can lead to device failure.

This propensity for this series of events to occur can be minimized by providing a low resistance path for the removal of holes from the parasitic base and by reducing the current gain of the parasitic npn 160. This may be achieved by contacting the body or p-well with the source connection 150.

But this body contact increases the size of n-channel MOSFET. Thus, there exists a trade-off between device size and immunity to this failure mechanism. A solution to this problem is to employ band-gap engineering techniques to narrow the energy gap of the source region with respect to the well region. This can be achieved by forming the source region using an alloy of $Si_{1-x}Ge_x$, where x is the mole fraction of germanium in the alloy, with typical values 0.1<x<0.3. In other embodiments, other concentrations can be used, for example the concentration of germanium can be less than 10 percent, or greater than 30 percent. The SiGe source region can be fabricated by standard techniques such as epitaxial growth or by ion implantation.

Figure 2:
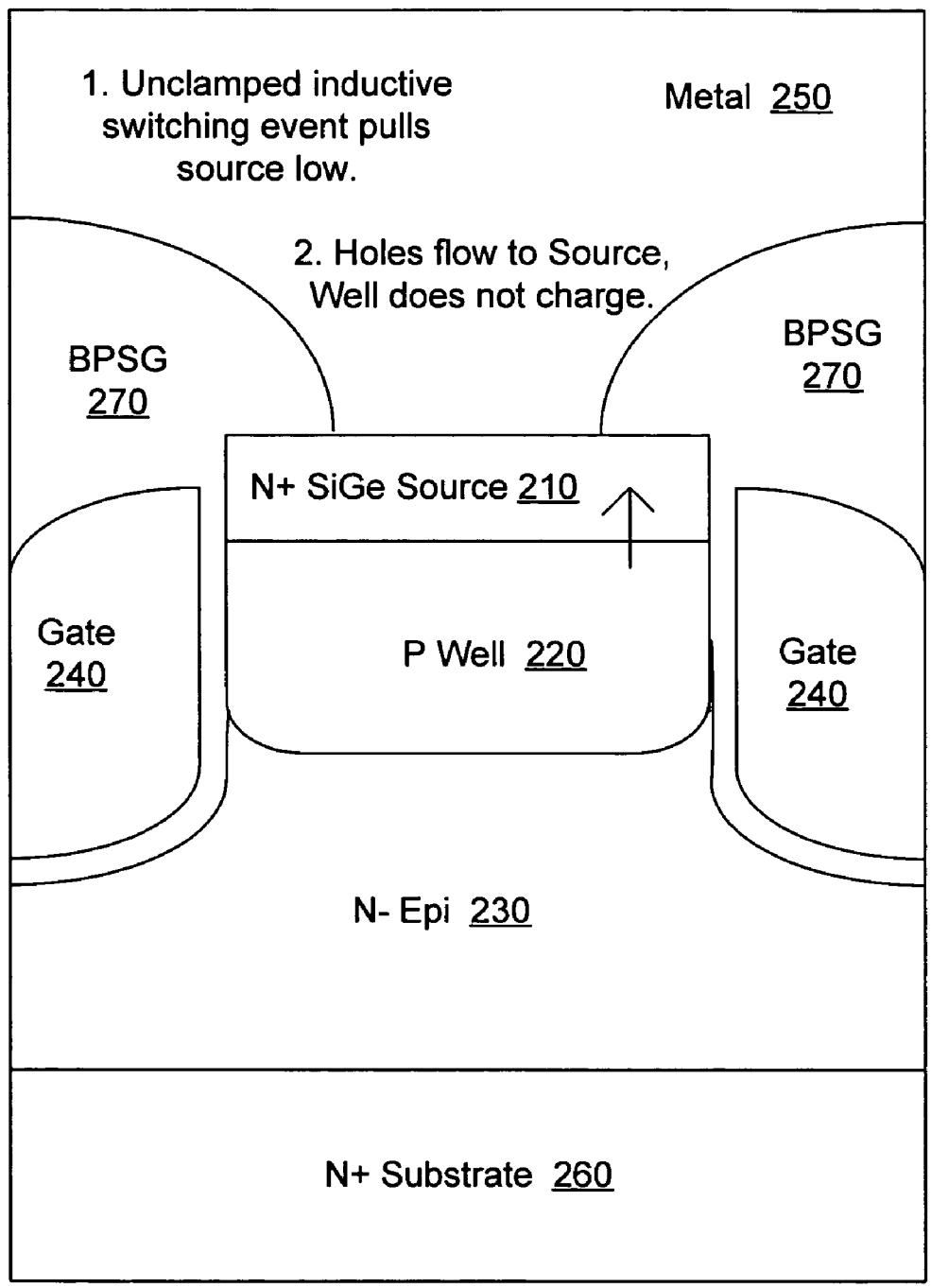
FIG. 2 illustrates a cross section of an n-channel trench-gate power MOSFET having a SiGe source according to an embodiment of the present invention.

FIG. 2 illustrates a cross section of an n-channel trench-gate power MOSFET having a SiGe source according to an embodiment of the present invention. This device includes an n-type source region 210 that is formed from silicon germanium, a body formed by p-well 220, n-type drain region 230, gates 240, metal contact 250, and n substrate 260. As seen in this figure, elimination of the p-well contact allows a significant reduction in cell pitch. This has the additional benefit of reducing on-state resistance and improving current conduction capability by increasing the size of the source region relative to the device of FIG. 1. This figure, as with the other included figures, is shown for illustrative purposes, and does not limit either the possible embodiments of the present invention or the claims. Also, while in this and the other figures an n-channel transistor is shown, embodiments of the present invention can similarly be used to improve p-channel devices. Features shown in other figures may also be included in this figure. For example, the p-well 220 may also be SiGe, while the gate may be poly SiGe.

The use of SiGe in the source 210 allows for holes to flow to the source, reducing the hole current in the body or p-well 220. Specifically, the presence of germanium in the alloy creates a narrowing of the energy gap (Eg) that is roughly proportional to the germanium mole fraction. Most of this band offset occurs in the valence band. This allows holes to easily flow to the source region, providing a path for hole removal reducing the npn gain. Now when an unclamped inductive event pulls the source low (1), the holes flow to the source 210, and the well does not charge (2).

Figure 3:
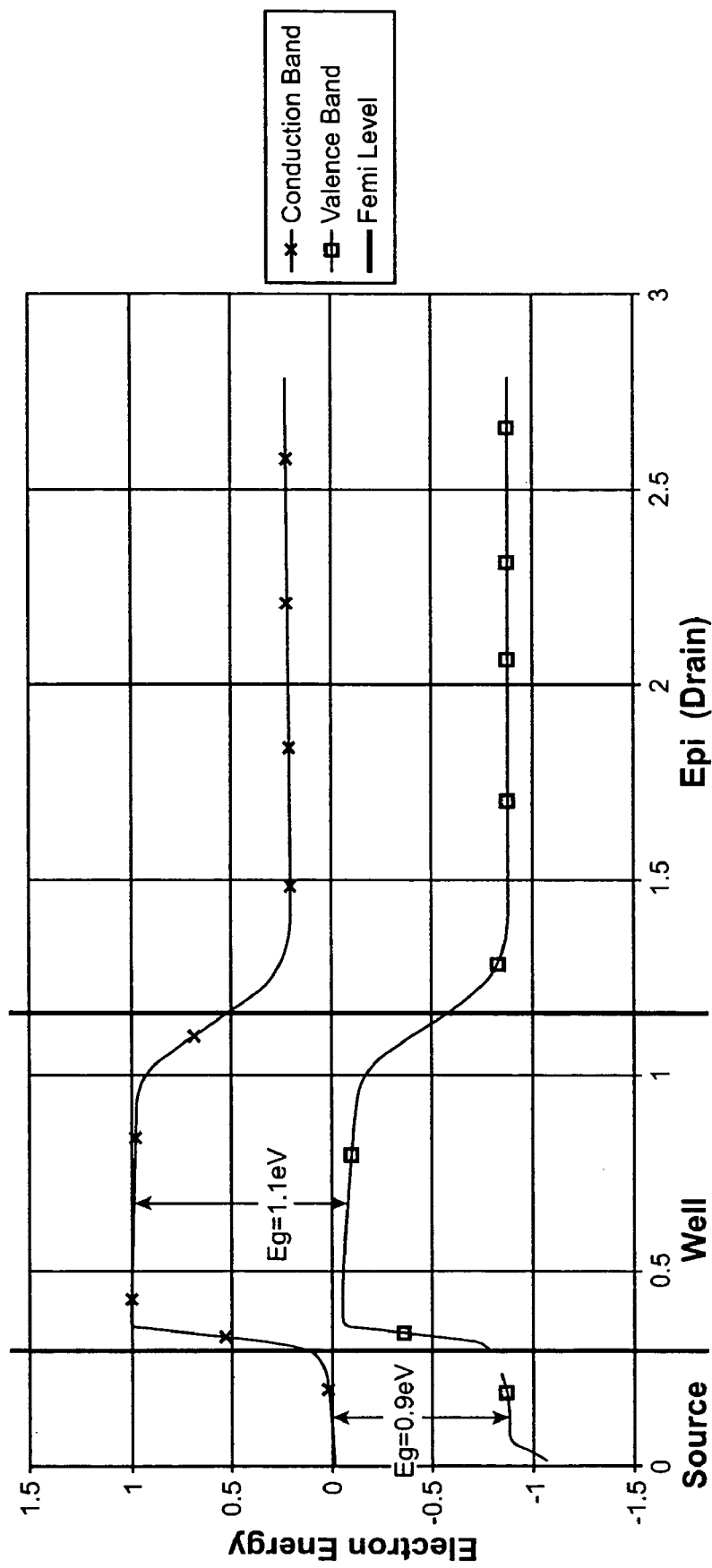
FIG. 3 illustrates the energy band structure through the source-to-well region of the device illustrated in FIG. 2.

FIG. 3 illustrates the energy band structure through the source-to-well region of the device illustrated in FIG. 2. FIG. 3 was calculated for a germanium mole fraction of 30%. The data show approximately a 0.21 eV reduction of the energy gap of the source with respect to the well, that is, 0.9 eV in the source compared with 1.1 eV in the well or body region. In theory, this leads to an increase in the hole current crossing the junction by a factor $\sim \exp(Eg/kT)$. In practice, the improvement is somewhat less than this, since not all the energy band offset occurs in the valence band.

In a specific embodiment of the present invention, the source 210 has a germanium content of 30 percent by mole fraction. A comparison between devices having a silicon source and this SiGe source shows an increase in hole current and reduction in the npn current gain for a device using a SiGe source region. Specifically, at a typical bias of 0.75V, the hole current is increased by about 100× and the parasitic current gain is reduced by a factor of about 500. This data should be considered worst case, since in practice the well region would not be left entirely floating, but would be remotely contacted in the third dimension (perpendicular to the illustrated cross-section of FIG. 2). This reduction in parasitic current gain makes it less likely that the parasitic transistor 160 would conduct current leading to a catastrophic failure during a UIS event.

Figure 4:
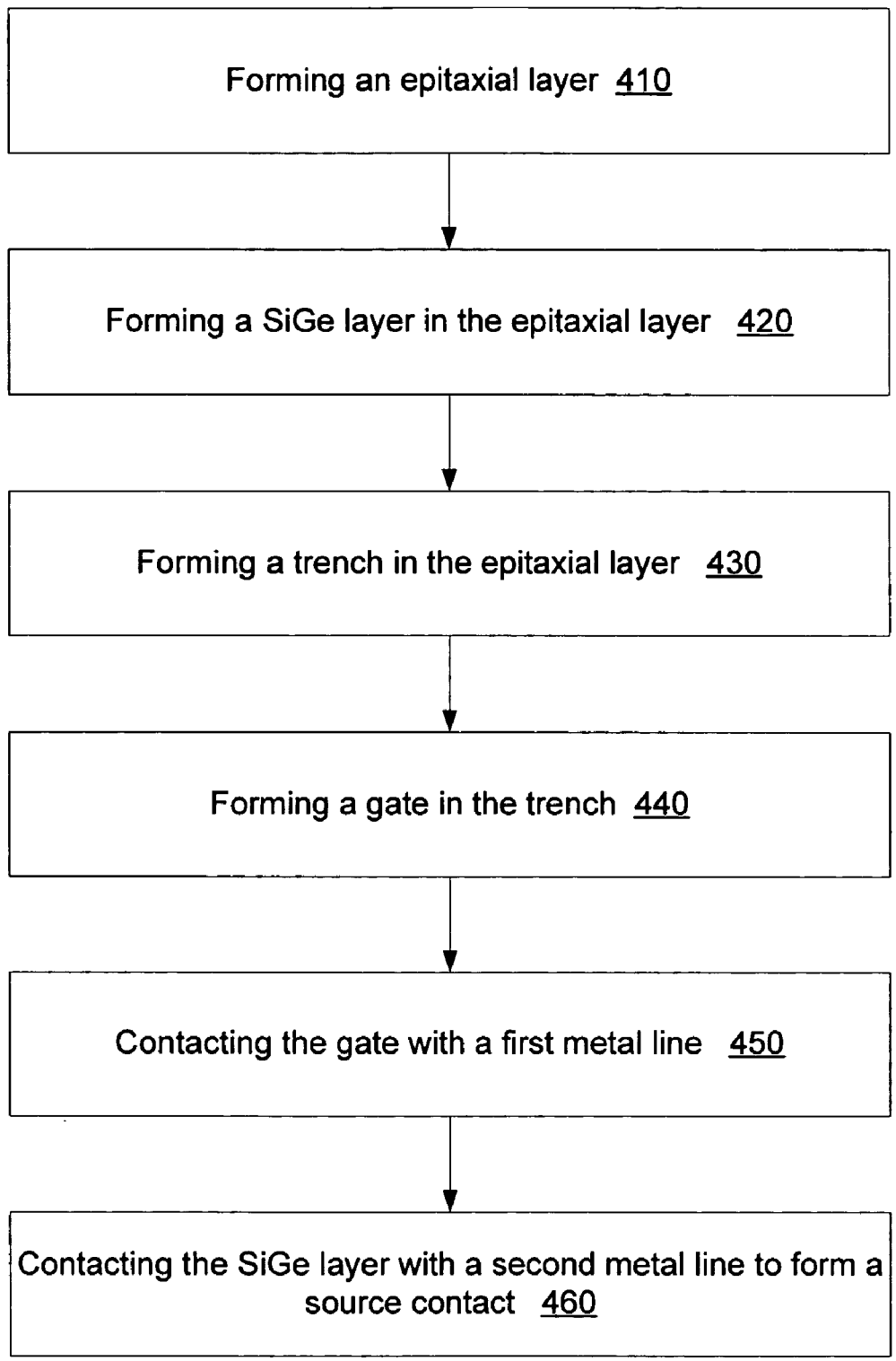
FIG. 4 is a flowchart of a method of manufacturing a trench-gate power MOSFET having a SiGe source according to an embodiment of the present invention.

FIG. 4 is a flowchart of a method of manufacturing a trench-gate power MOSFET having a SiGe source according to an embodiment of the present invention. In this embodiment, a SiGe source is formed in order to achieve a greater immunity to failure caused by an unclamped inductive switching event.

Specifically, in act 410, an epitaxial layer is formed. A SiGe layer is formed in the epitaxial layer in act 420. A trench is cut in the epitaxial layer in act 430, while in act 440, a gate is formed in the trench. The gate is contacted with metal, and the SiGe layer is contacted to form a source region in acts 450 and 460.

These trench-gate power MOSFETs are particularly useful in low-voltage DC-to-DC converter applications due to their low conduction losses and fast switching time. But the source being pulled low is not the only inductive effect these devices are exposed to. During normal operation, the MOSFET source can become positively biased with respect to the drain, leading to turn-on of the parasitic body-to-drain diode (also commonly referred to as the body diode). It should also be noted that while this and the other embodiments of the present invention are well suited to DC-to-DC power converters, other types of systems may incorporate devices that are improved by the incorporation of embodiments of the present invention.

Figure 5:
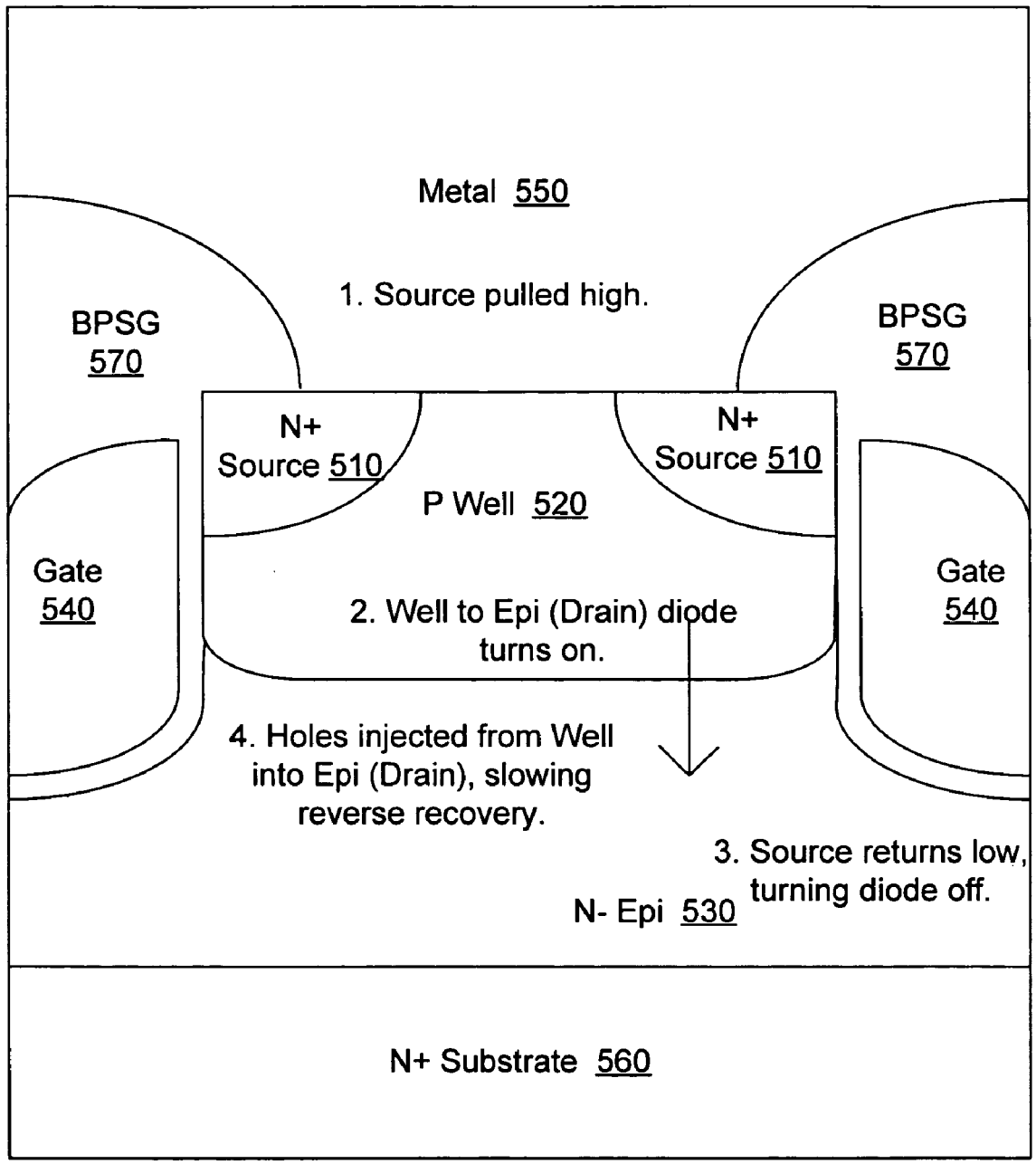
FIG. 5 is a cross section of an n-channel trench-gate power MOSFET that is improved by the incorporation of an embodiment of the present invention.

FIG. 5 illustrates this mechanism. This device includes n-type source regions 510, p-type body region 520, n-type drain region 530, gates 540, and metal contact 550. Specifically, the source can be pulled high (1). This causes the body or well diode to turn on (2). When the source returns low (3), holes continue to be injected into the epi 530 or drain. This hole current slows the reverse recovery (4). This leads to energy losses due to both the forward conduction of the diode and also the reverse recovery of the diode. The dissipated power can be roughly approximated as follows:

$$P_{cond} = V_f \times I_{out} \times t_{deadtime} \times F_{sw}$$

$$P_{sw} = V_{in} \times trr \times \frac{Irr}{2} \times I_{out} \times F_{sw}$$

Where $V_f$ is the body-diode forward voltage, Iout is the diode forward current, Fsw is the switching frequency, trr is the reverse recovery time, and Irr is the reverse recovery current. For a typical n-channel MOSFET, the reverse recovery characteristics are primarily governed by holes injected from the body region (p-type) into the drain region (n-type).

This analysis shows that diode energy losses can be decreased by reducing the diode forward voltage, reverse recovery current, and reverse recovery time simultaneously. Unfortunately, for conventional silicon technology, there exists an inverse relationship between the reverse recovery parameters and the forward voltage. Techniques that improve the forward voltage typically degrade the reverse recovery, while those that improve reverse recovery degrades the forward voltage. This makes their simultaneous reduction impractical using conventional silicon techniques.

Embodiments of the present invention employ band-gap engineering techniques to narrow the energy gap of the body region with respect to the drain epitaxial region. This can be achieved by forming the transistor body region to include an alloy of $Si_{1-x}Ge_x$ where x is the mole fraction of germanium in the alloy, with typical values 0.1<x<0.3. In other embodiments, other concentrations can be used, for example the concentration of germanium can be less then 10 percent, or greater than 30 percent. The body region comprising $Si_{1-x}Ge_x$ can be fabricated by standard techniques such as epitaxial growth or by ion implantation.

Figure 6:
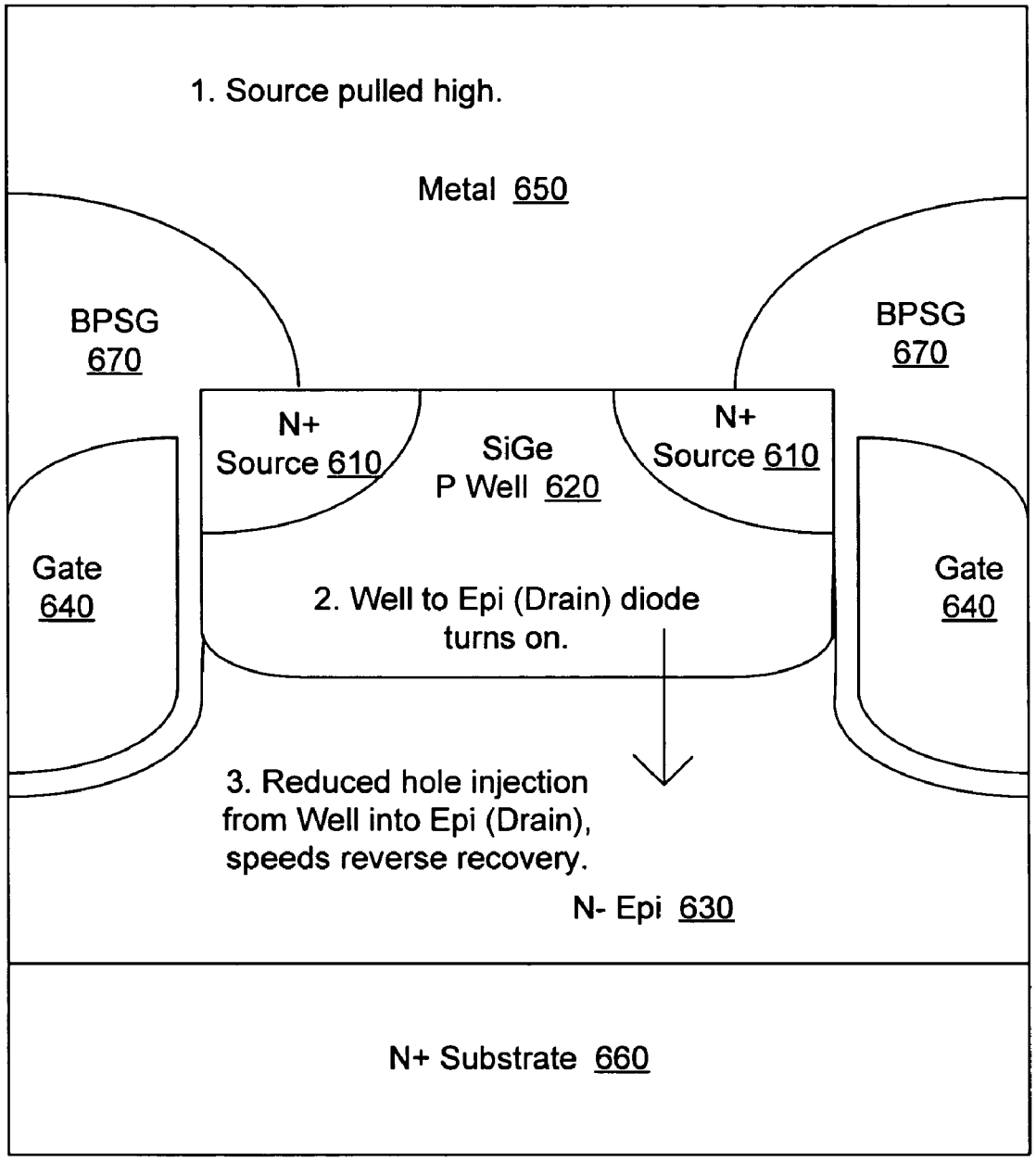
FIG. 6 is a cross section of an n-channel trench-gate power MOSFET having a SiGe well according to an embodiment of the present invention.

FIG. 6 is a cross section of an n-channel trench-gate power MOSFET having a SiGe well according to an embodiment of the present invention. This device includes n-type source regions 210 and p-type body region 220, which comprises silicon germanium, n-type drain region 230, and gates 240. It should be noted that the p-type body region 220 to metal 250 contact area can be omitted, as it was in FIG. 2 above. Also, the gate may be polysilicon germanium, or poly SiGe.

The presence of germanium in the alloy creates a narrowing of the energy gap (Eg) that is roughly proportional to the germanium mole fraction. The effect of the smaller bandgap in the body region is to increase electron injection at a given forward bias. This in turn implies reduced hole injection for a given current density.

Figure 7:
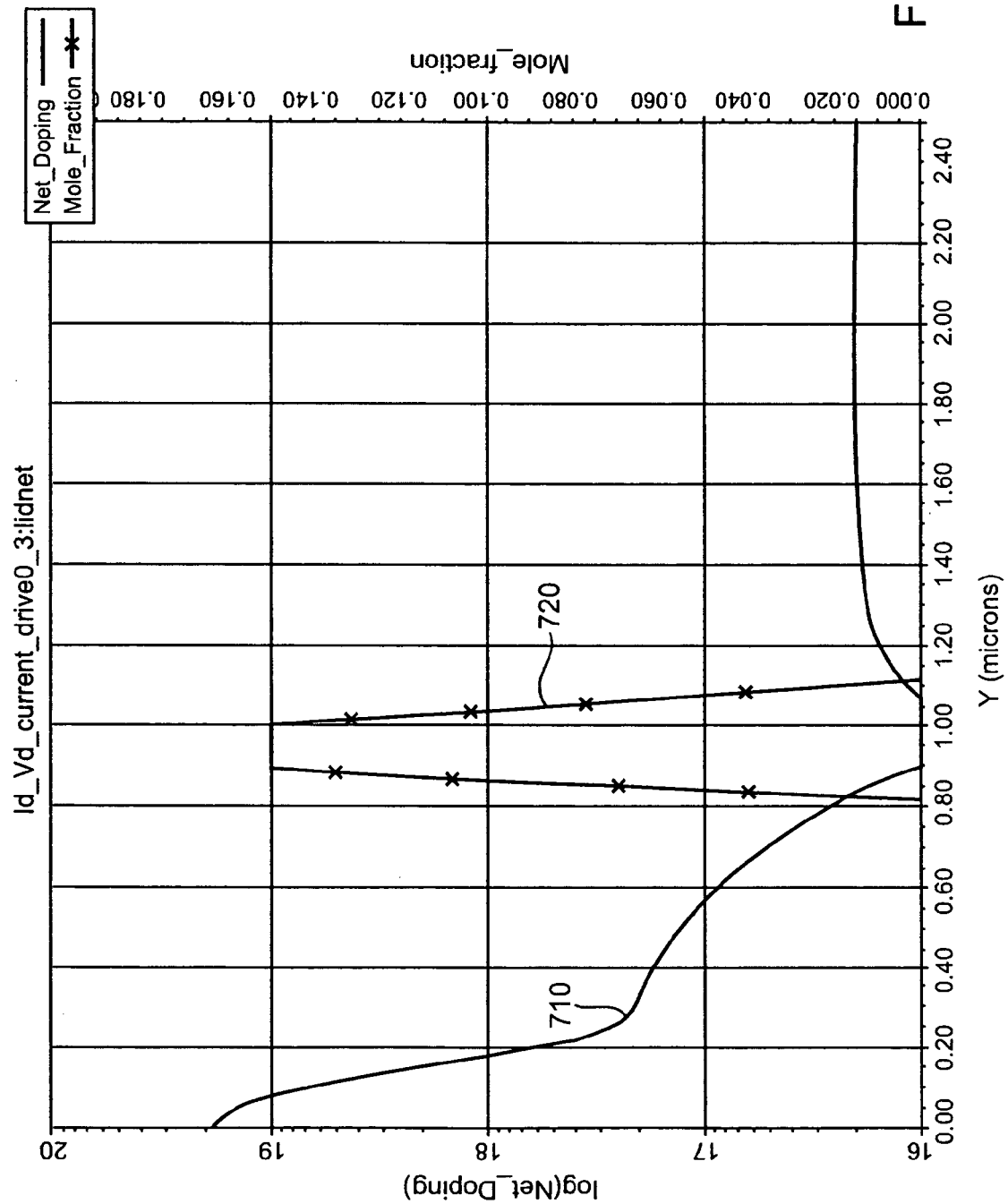
FIG. 7 illustrates the net doping and germanium mole fraction of the MOSFET shown in FIG. 6.

FIG. 7 illustrates the net doping and germanium mole fraction of the MOSFET shown in FIG. 6. The net doping 710 and germanium mole fraction 720 are plotted along the Y-axis as a function of depth along the X-axis. The net doping is typical of that in the trench-gate MOSFET body and drain regions. The germanium profile has a peak mole fraction of 0.15 and width of 100 nm at its peak.

Figure 8:
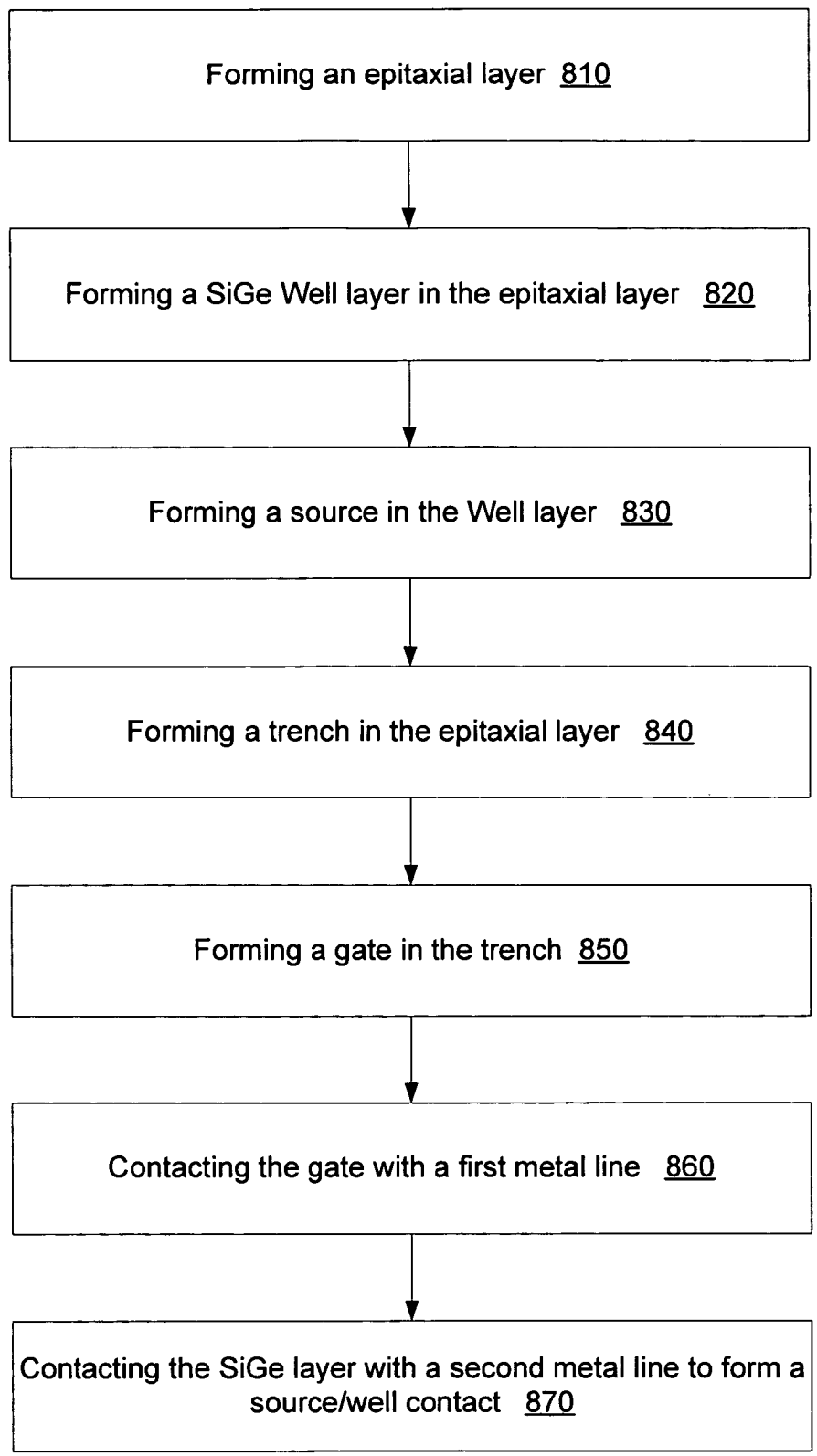
FIG. 8 is a flowchart of a method of manufacturing a trench-gate power MOSFET having a SiGe well region according to an embodiment of the present invention.

FIG. 8 is a flowchart of a method of manufacturing a trench-gate power MOSFET having a SiGe well region according to an embodiment of the present invention. In this embodiment, a trench-gate power transistor having a SiGe body region is formed.

Specifically, in act 810, an epitaxial layer is formed. A SiGe well is formed in act 820. This layer can be grown on the epitaxial layer formed in act 810, or it may be implanted into the epitaxial layer formed in act 810. A source is formed in the well in act 830.

A trench is formed or cut in the epitaxial layer in act 840, and a gate is formed in the trench in act 850. The gate is contacted, and the source is contacted in acts 860 and 870.

In a specific embodiment of the present invention, the use of silicon germanium results in a significant decrease in hole current as well as a small reduction in the forward voltage. In this embodiment, at a typical bias of 0.75V, the hole current is decreased by a factor of approximately 5 as compared to a silicon well structure. This results in a significant improvement in the reverse recovery characteristics of the transistor. Further, unlike conventional techniques wherein improved reverse recovery is obtained at the expense of increased forward voltage, the improvement in reverse recovery is achieved along with a reduction in the forward voltage.

These trench-gate power MOSFETs can be used in DC-to-DC converter circuits to achieve voltage conversion with a high efficiency, that is, with a minimum loss of power. Some improvements that can be made to these devices to achieve this goal include lowering device on resistance ($Rds_{on}$), input capacitance ($C_{iss}$), gate charge ($Q_g$ and $Q_{gd}$), gate impedance (ESR or $R_g$), body diode reverse recovery ($T_{rr}$), or a combination of the above.

Conventionally, gate impedance reduction is commonly achieved by saturating gate doping or by adding silicide. Unfortunately, due to the large thermal budget (high temperatures) in trench-gate MOSFET devices, large concentrations of dopant in the gate can enhance dopant penetration into the channel (or well or bulk), particularly when gate oxide is thin. This dopant penetration results in a shift in device threshold voltage ($V_{th}$). As can be seen in the next figure, the effectiveness of adding a silicide layer is also limited.

Figure 9:
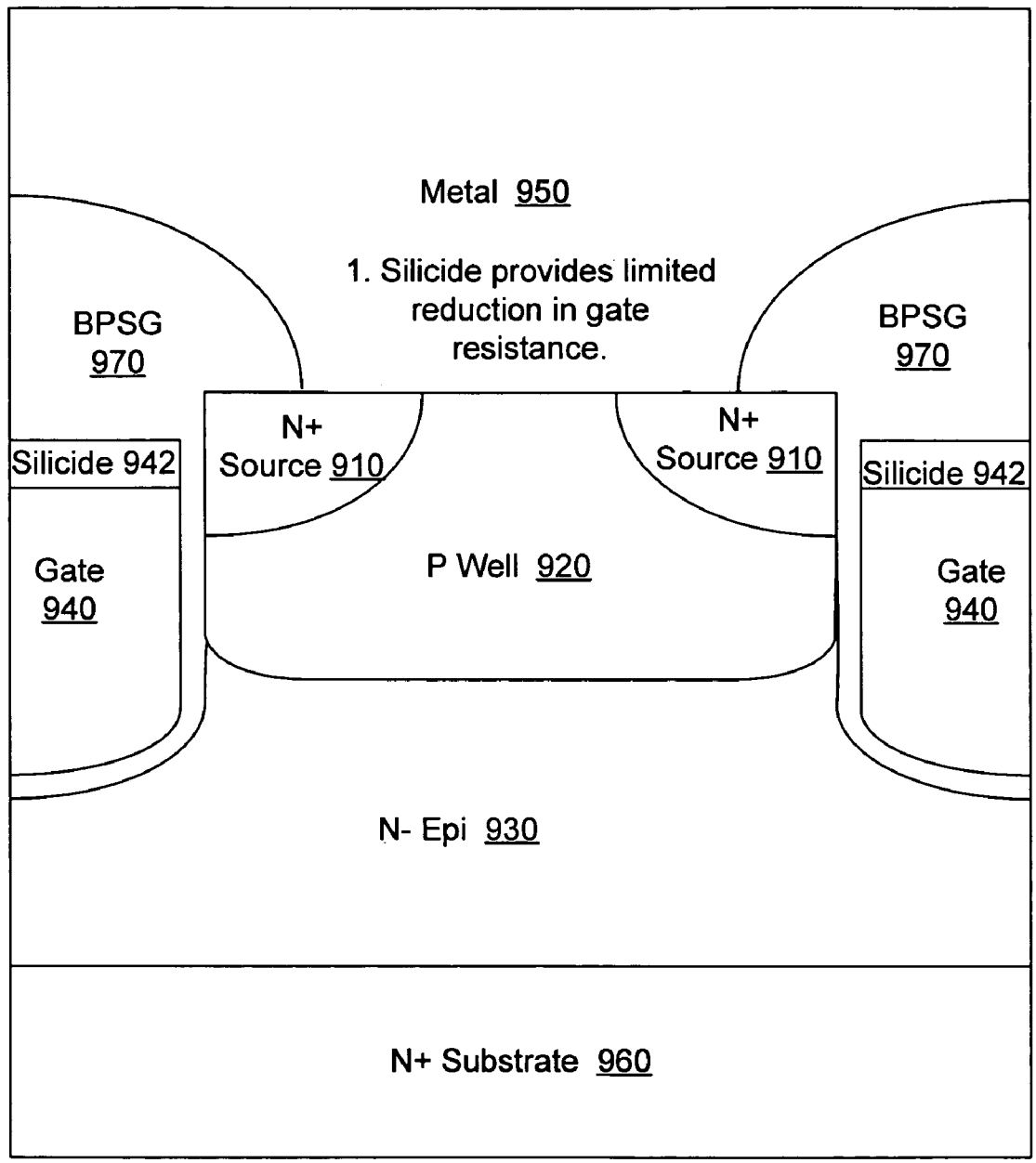
FIG. 9 is a cross section of an n-channel trench-gate power MOSFET that is improved by the incorporation of an embodiment of the present invention.

FIG. 9 is a cross section of an n-channel trench-gate power MOSFET that is improved by the incorporation of an embodiment of the present invention. This cross section includes a device having a gate 940, source 910, body or well region 920, and drain or epi region 930. The gate 940 includes a silicide layer 942. In a trench-gate power MOSFET device, a small gate dimension is desirable for low voltage, low $Rds_{on}$, and low cost. But the narrow gate dimension limits the effectiveness of the silicide layer 942. That is, the portion of the gate 940 below the silicide layer 942 retains the characteristics of polysilicon: it does not benefit from the presence of the silicide layer 942.

Accordingly, embodiments a lower gate resistance to enable faster switching speeds for MOS-gated power transistors without the above drawbacks and limitations. Specifically, embodiments of the present invention provide a lower gate resistance by using a polysilicon germanium ($Si_{1-x}Ge_x$) gate for MOS-gated power transistors such as power trench-gate MOSFET transistors. Incorporating a poly $Si_{1-x}Ge_x$ gate offers improved performance as compared to devices utilizing a conventional polysilicon and silicided gate.

For example, the smaller bandgap of $Si_{1-x}Ge_x$ results in a larger number of carriers at a given temperature and doping concentration. This in turn reduces gate depletion that shifts the threshold voltage $V_{th}$ and also lowers gate impedance. Moreover, the carrier mobility in poly $Si_{1-x}Ge_x$ is over 3 times higher than that of poly silicon. This further lowers gate impedance by 67% and allows the transistor to switch faster.

Figure 10:
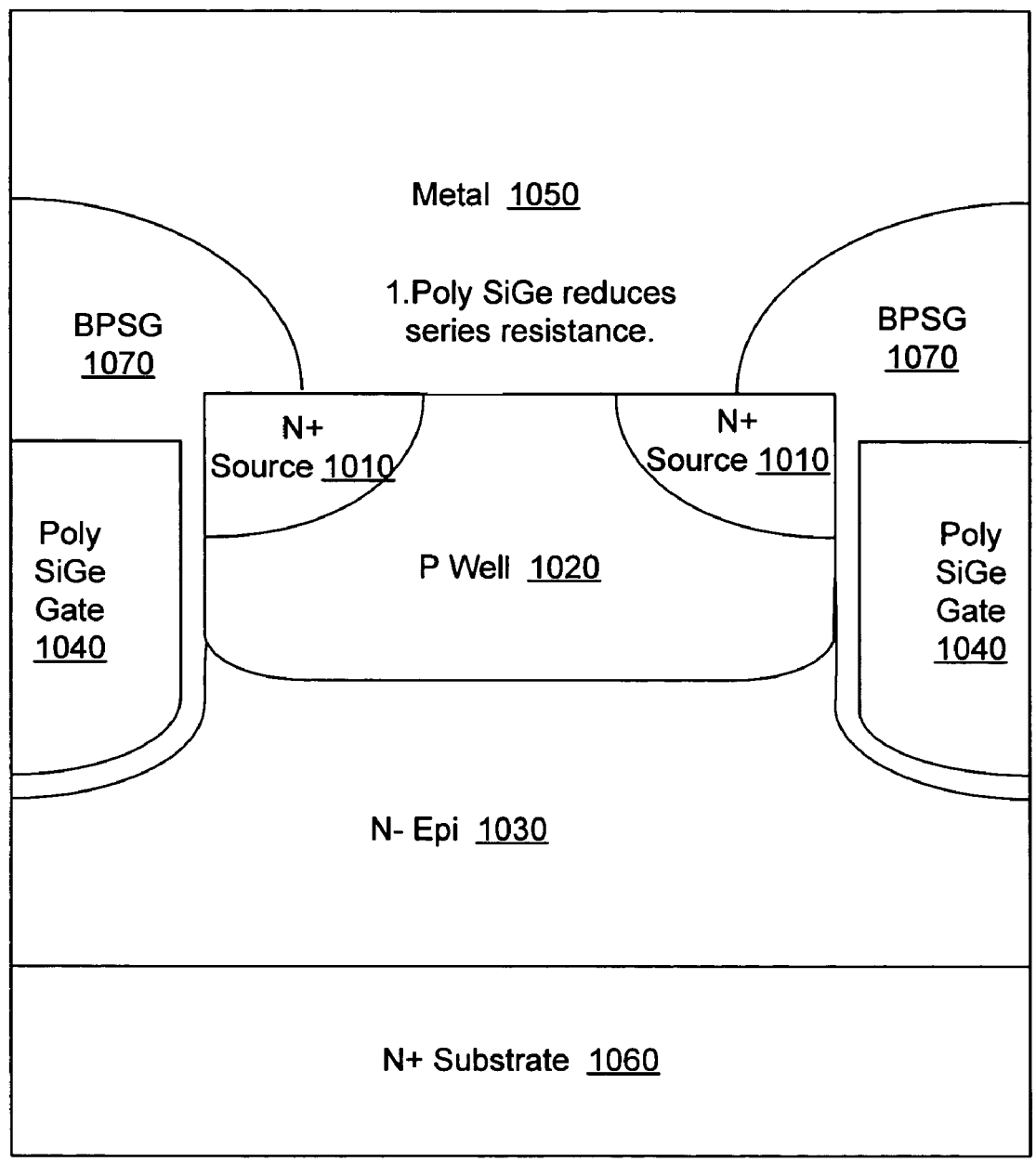
FIG. 10 is a cross section of an n-channel trench-gate power MOSFET having a poly SiGe gate according to an embodiment of the present invention.

FIG. 10 is a cross section of an n-channel trench-gate power MOSFET having a poly SiGe gate according to an embodiment of the present invention. This cross section includes a device having a gate 1040, source 1010, body or well region 1020, and drain or epi region 1030. In this embodiment, the entirety of the gate 1040 benefits from the lower resistance of the poly SiGe, as opposed to the narrower improvement provided by the silicide layer 942 in FIG. 9. It should be noted that the p-type body region 1020 to metal 1050 contact area can be omitted, as it was in FIG. 2 above. Also, the source 1010, p-well 1020, or both, may be formed using SiGe.

Poly SiGe gates can also be used to improve electrostatic discharge devices. For example, a Zener device (n⁺p) built using a $Si_{1-x}Ge_x$ poly gate is able to withstand higher electrostatic discharge power than that of a conventional poly silicon gate device. High carrier mobility of poly $Si_{1-x}Ge_x$ reduced series resistance, particularly in the low doped p-type regions of the Zener, resulting in less ohmic loss and a cooler operation. As with the other embodiments shown, p-channel devices can also be improved. In p-channel devices, boron penetration from a $Si_{1-x}Ge_x$ poly gate to body or well via the gate oxide is reduced. This allows the use of thin oxide without threshold voltage instability.

Gate series resistance is greatly reduced using a SiGe poly gate. By way of comparison, a silicided gate only lowers gate resistance by a factor of two in a conventional trenched gate device. This limited decrease is due to the small geometry available for silicide formation over the gate material in a narrow trench. Using poly $Si_{1-x}Ge_x$ as gate material reduces the gate impedance by more than 67% under the same gate cross section, thus offering an even better performance without the extra expense and difficulty of using a silicide process. Moreover, poly SiGe remains stable at 1000° C. while the use of a silicided gate limits subsequence process temperature to less than 850° C. due to possible agglomeration. Among other advantages and feature, the use of the poly SiGe gate 1040 eliminates the need for a silicide layer 942 on the gate.

Figure 11:
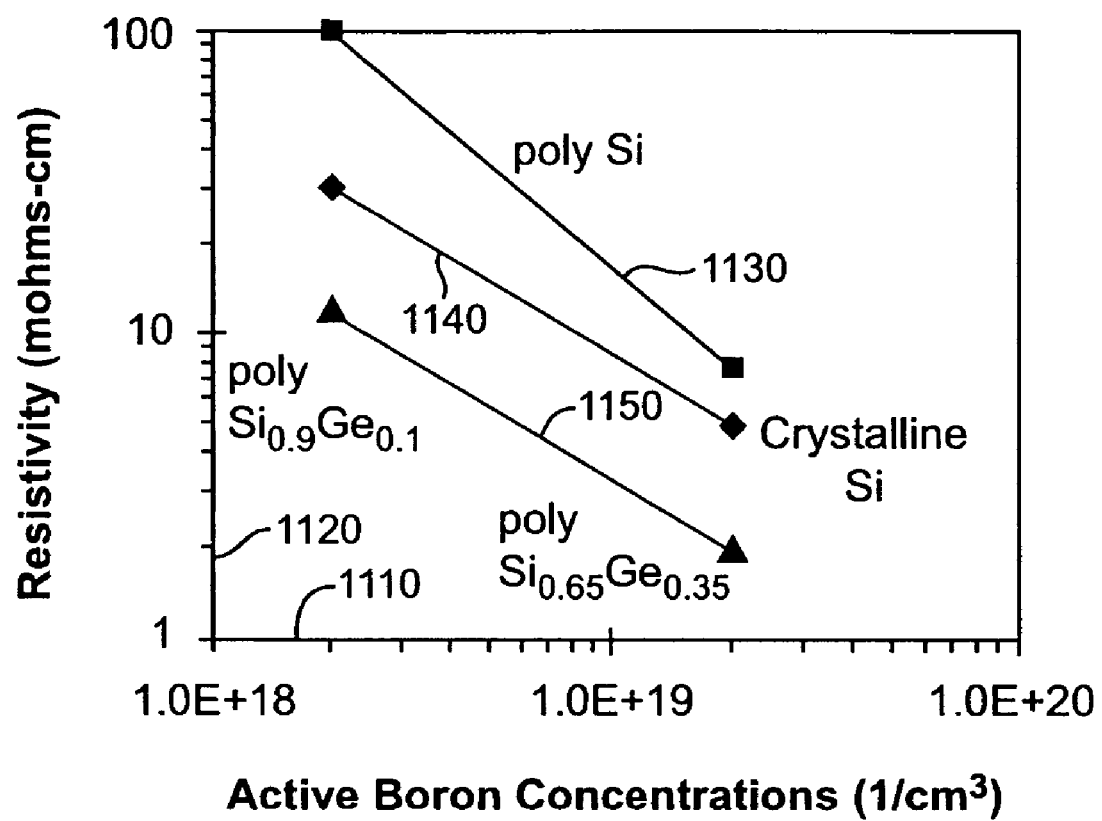
FIG. 11 illustrates material resistivity as a function of boron concentration for various materials.

FIG. 11 illustrates material resistivity as a function of boron concentration for various materials. As can be seen, the resistivity of SiGe poly is much less than conventional polysilicon. In this example, the concentration of germanium is 35 percent by mole fraction at boron concentration of 2×10^^19, where ^^ is a symbol for "to the power of." In other embodiments, the concentration may be higher than 35 percent, or less than 35 percent.

Figure 12:
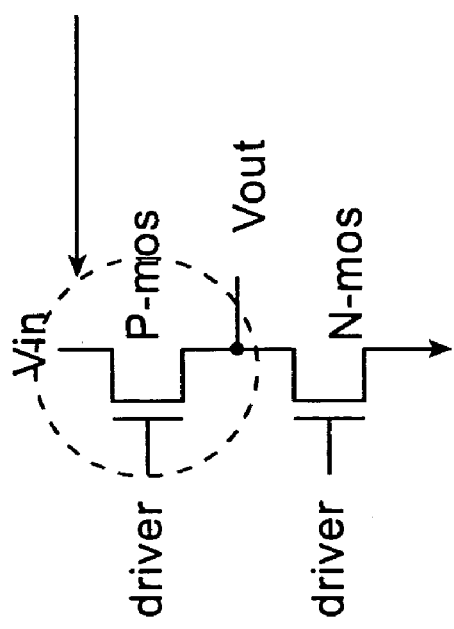
FIG. 12 illustrates a DC-DC converter output including a p-channel high-side power-MOSFET device and an n-channel low-side power-MOSFET device.

Overall, using poly $Si_{1-x}Ge_x$ gate can reduce gate impedance without altering existing layout, and the process is compatible to present silicon technologies. The benefit of a 67% reduction in gate impedance becomes evident when considering the efficiency of a DC-DC converter having a p-channel high-side MOSFET and an n-channel one on the low side as shown in FIG. 12.

Figure 13:
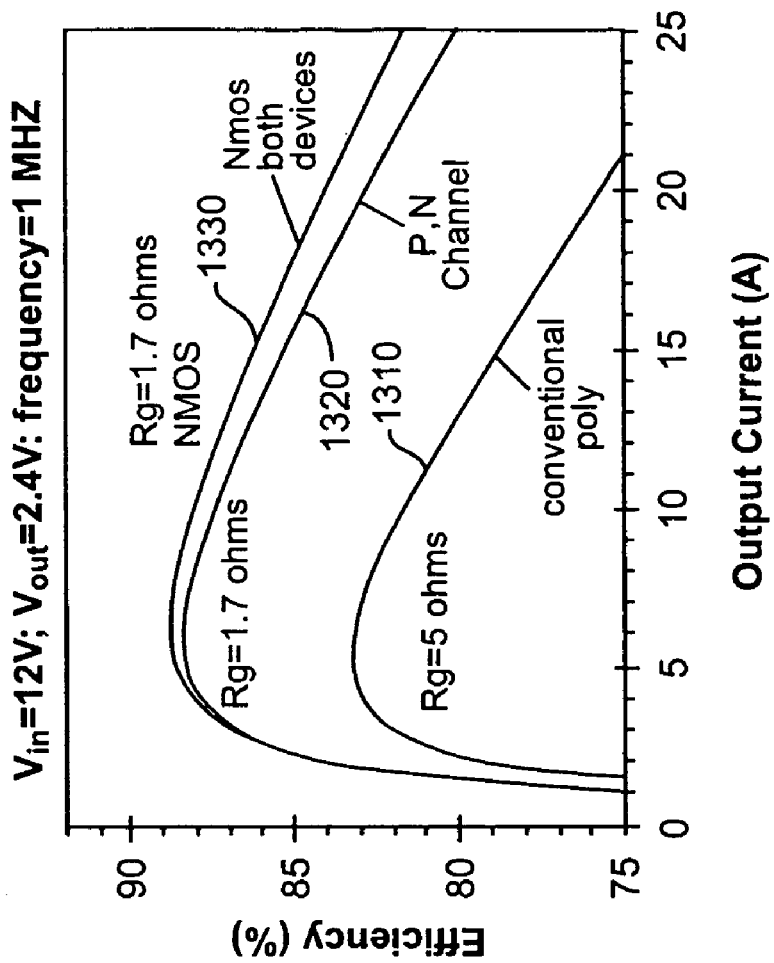
FIG. 13 illustrates the increase in efficiency provided by the incorporation of an embodiment of the present invention.

FIG. 13 illustrates the increase in efficiency provided by the incorporation of an embodiment of the present invention. The results in FIG. 13 indicate that the peak efficiency increases from 83% to 88%. This equates to a saving of 30% power that would otherwise be lost. Specifically, the peak efficiency for a conventional poly gate 1310 is lower than the peak efficiency for a SiGe gated device 1320. Data in FIG. 13 also suggests that this converter efficiency is approaching to that with n-channel MOSFETs in both the high- and low-side (curve 1330). This significantly reduces the power consumption of gate driver and will enable designers to simplify driver circuits but at the expense of 1-2% efficiency loss at high output current.

Table 1 lists electrical properties for various materials that could be used in forming a MOSFET gate. Again, SiGe poly has a lower resistivity than conventional polysilicon. Using this material as a gate reduces gate series resistance and increases circuit efficiency.

TABLE 1

Electrical properties of various gate materials

| Gate Material (concentration = 2 × 10¹⁸ cm⁻³) | Mobility (cm²/V/sec) | Resistivity mΩ-cm |
|---|---|---|
| p-type crystalline silicon | 78 | 30 |
| p-type poly silicon | NA | 100 [8] |
| p-type $Si_{0.9}Ge_{0.1}$ | 275 [3] | 12 |
| p-type poly silicon (2 × 10¹⁹) | NA | 7.5 [9] |
| p-type $Si_{0.65}Ge_{0.35}$ (2 × 10¹⁹) | NA | 2.0 [9] |

Figure 14:
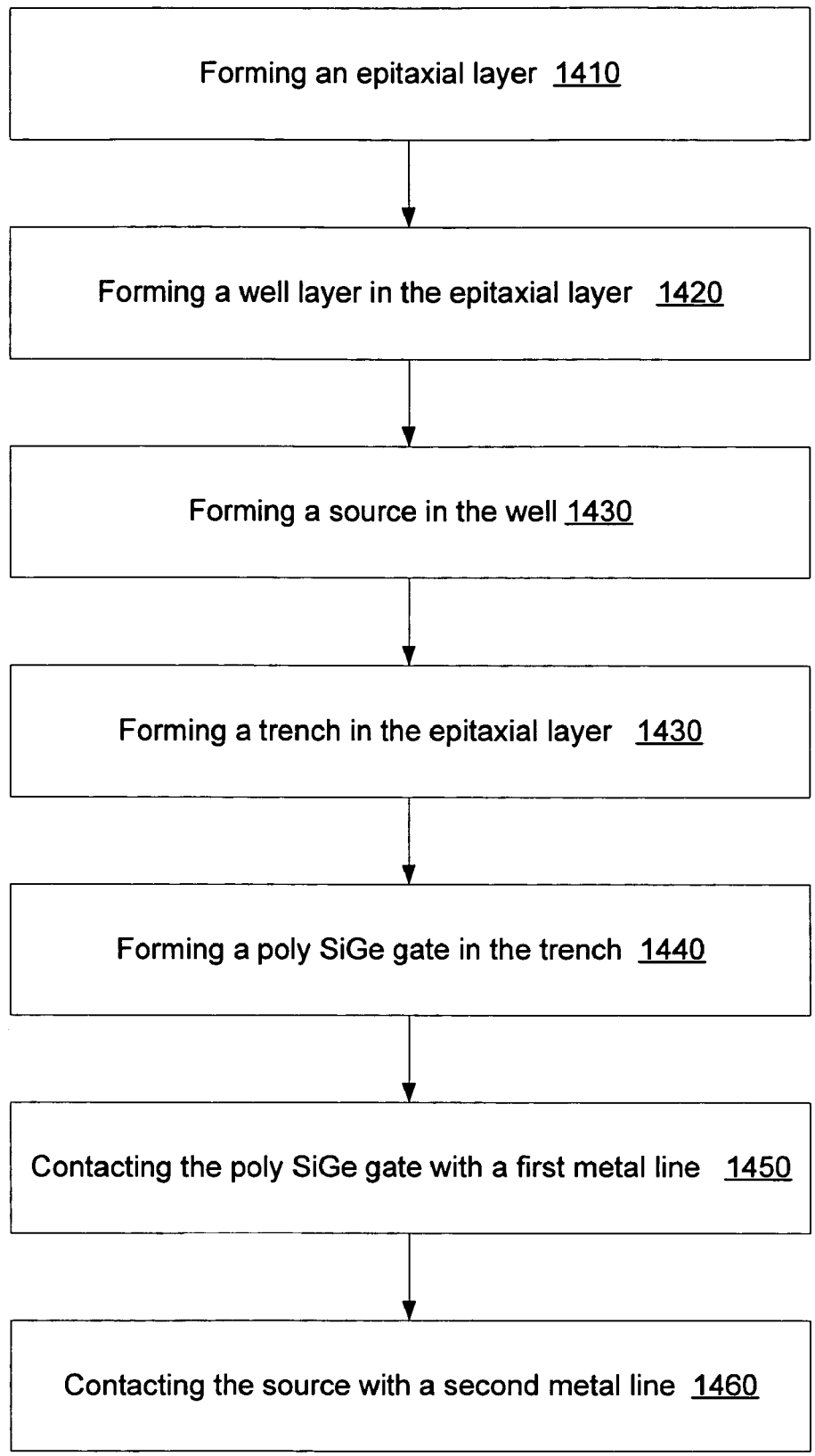
FIG. 14 is a flowchart of a method of manufacturing a trench-gate power MOSFET having a poly SiGe gate according to an embodiment of the present invention.

FIG. 14 is a flowchart of a method of manufacturing a trench-gate power MOSFET having a poly SiGe gate according to an embodiment of the present invention. In this embodiment, a poly SiGe gate is incorporated into a trench-gate power MOSFET device.

Specifically, in act 1410, an epitaxial layer is formed. In act 1420, a well layer is formed in the epitaxial layer. A source is formed in the well in act 1430.

In act 1430, a trench is formed in the epitaxial layer. A poly SiGe gate is formed in the trench in act 1440. The poly SiGe gate and source are contacted in acts 1450 and 1460.

Even with a poly SiGe gate, or a SiGe source, channel impedance limits the performance of trench-gated power MOSFET devices. That is, it is desirable to reduce the on-resistance (Rdson) of MOS-gated power transistors such as n-channel and p-channel power trench-gate MOSFET devices, particularly in low voltage applications. For example, in the application of synchronous DC-DC converter, the gate driver for a p-channel MOSFET consumes less power than a driver for an n-channel device. Thus, it is very desirable to use p-channel devices for the high side driver instead of n-channel devices, as shown in FIG. 12.

But the Rdson for a p-channel device is much higher than a similar n-channel MOSFET, and this limits its application to only small current region. In low voltage applications, channel resistance dominates the device Rdson. The channel resistance ($R_{ch}$) is:

$$R_{ch} = \frac{L}{Z\mu_p C_{ox}(V_G - V_T)}$$

where L is the channel length, Z is the channel width, $C_{ox}$ is the gate oxide capacitance per unit area, $V_G$ is the gate voltage and $V_T$ is the threshold voltage. To reduce channel resistance, it is desired to shrink channel length, gate oxide thickness, and lower the threshold voltage. Due to the process limitation or sub-threshold issue, these approaches are limited.

In transistors such as the transistor of FIG. 1, the series on-resistance is dominated by the resistivity of the well region 120, particularly the resistivity of the portion of the well region 120 near the gates 140. If this resistivity is reduced, the series on-resistance of the device is reduced. One way to reduce this resistivity is to utilize a material having a higher mobility. Specifically, if the portion of the channel that begins to conduct first, that is the portion near the gates 140, is made of a higher mobility material, the series on-resistance can be reduced. Accordingly, embodiments of the present invention employ strained $Si_{1-x}Ge_x$ in its channel area to reduce channel resistance.

Figure 15:
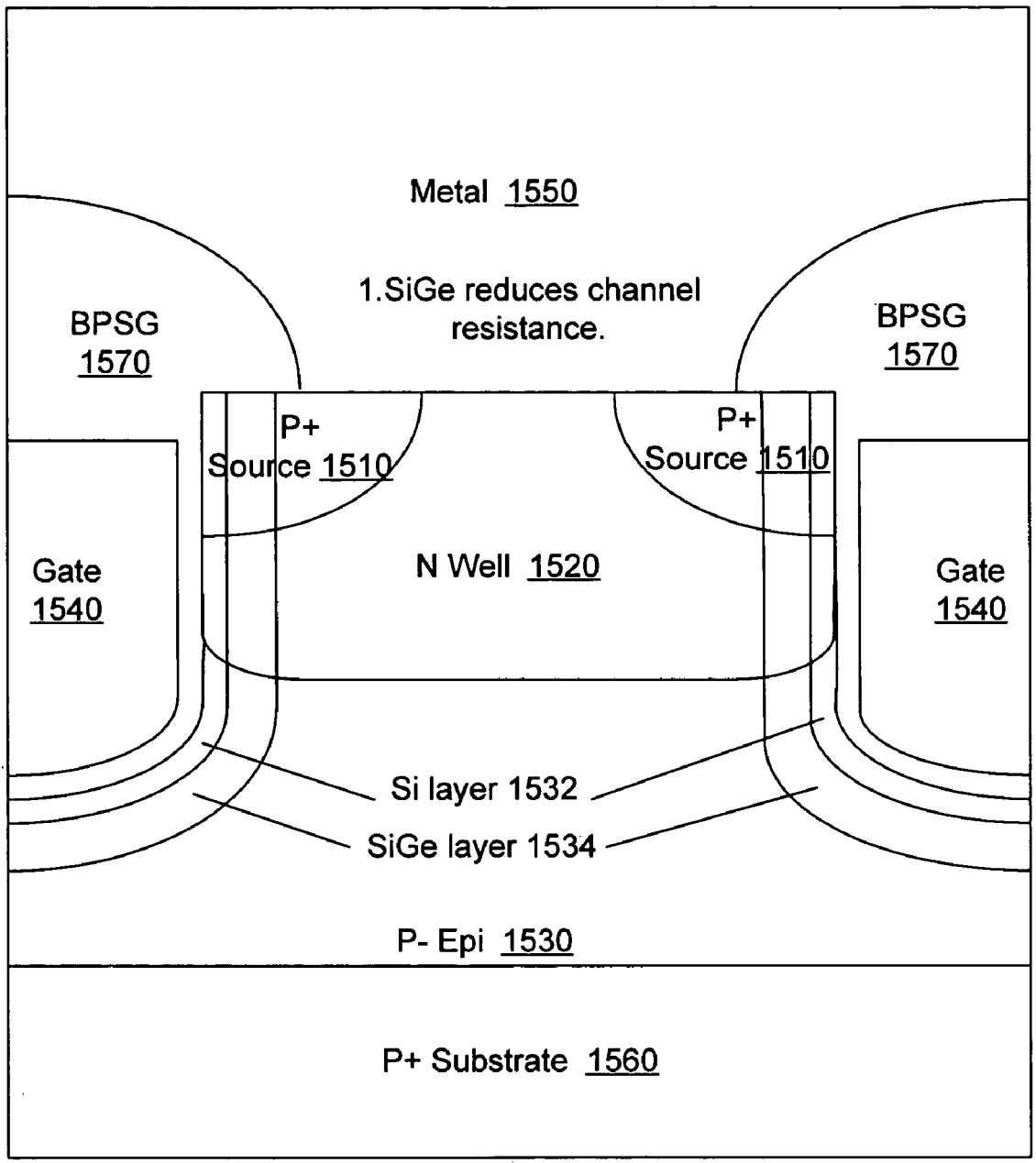
FIG. 15 is a cross section of a p-channel trench-gate power MOSFET having a SiGe channel region according to an embodiment of the present invention.

FIG. 15 is a cross section of a p-channel trench-gate power MOSFET having a SiGe channel region according to an embodiment of the present invention. This device includes p-type source regions 1510, an n-well or body 1520, p-type drain region 1530, gates 1540, a SiGe layer 1534. The SiGe layer 1534 is isolated from the gates 1540 by a silicon layer 1532. This silicon layer 1532 provides a proper interface to the polysilicon gate. It should be noted that the n-type body region 1520 to metal 1550 contact area can be omitted, as the p-type body region contact was removed in FIG. 2 above. Also, the source 1510 may be formed using SiGe, while the gate 1540 may be poly SiGe.

A layer of $Si_{1-x}Ge_x$ layer 1534 is grown commensurately along the sidewall of a silicon trench. Because the lattice constant of $Si_{1-x}Ge_x$ is larger than that of silicon, depending on the germanium mole fraction, the $Si_{1-x}Ge_x$ layer is under biaxial compressive strain in [100]/[010] directions. A strained $Si_{1-x}Ge_x$ planar layer has increased hole mobility compared to that of bulk silicon under either compressive or tensile biaxial strains. This increased mobility results in reduced resistivity in the SiGe layer 15341.

Figure 16:
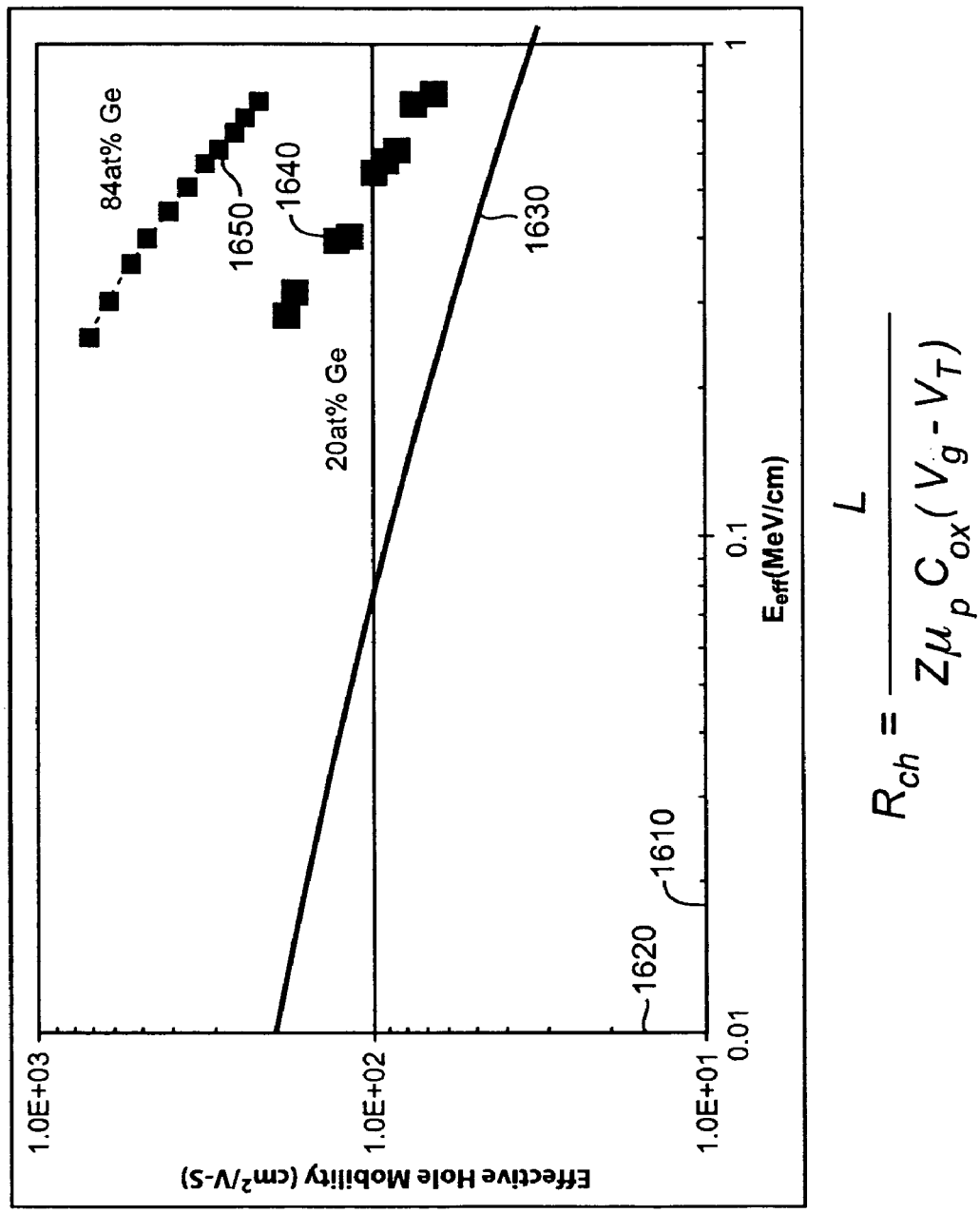
FIG. 16 shows the hole mobility measured of two different SiGe films grown on relaxed $Si_{1-x}Ge_x$ virtual substrate.

FIG. 16 shows the hole mobility measured of two different $Si_{1-x}Ge_x$ films grown on relaxed $Si_{1-x}Ge_x$ virtual substrate. The bulk silicon universal mobility curve 1630 is included as a basis of comparison. The hole mobility in $Si_{1-x}Ge_x$ channel layer is greatly enhanced due to valence band splitting and shape change of valence band. This enhancement also depends on the germanium concentration relative to that in $Si_{1-x}Ge_x$ virtual substrate; indicating a strain related phenomena. The improved hole mobility with 20 at % Ge 1640 and 84 at % Ge 1650 are shown.

Figure 17:
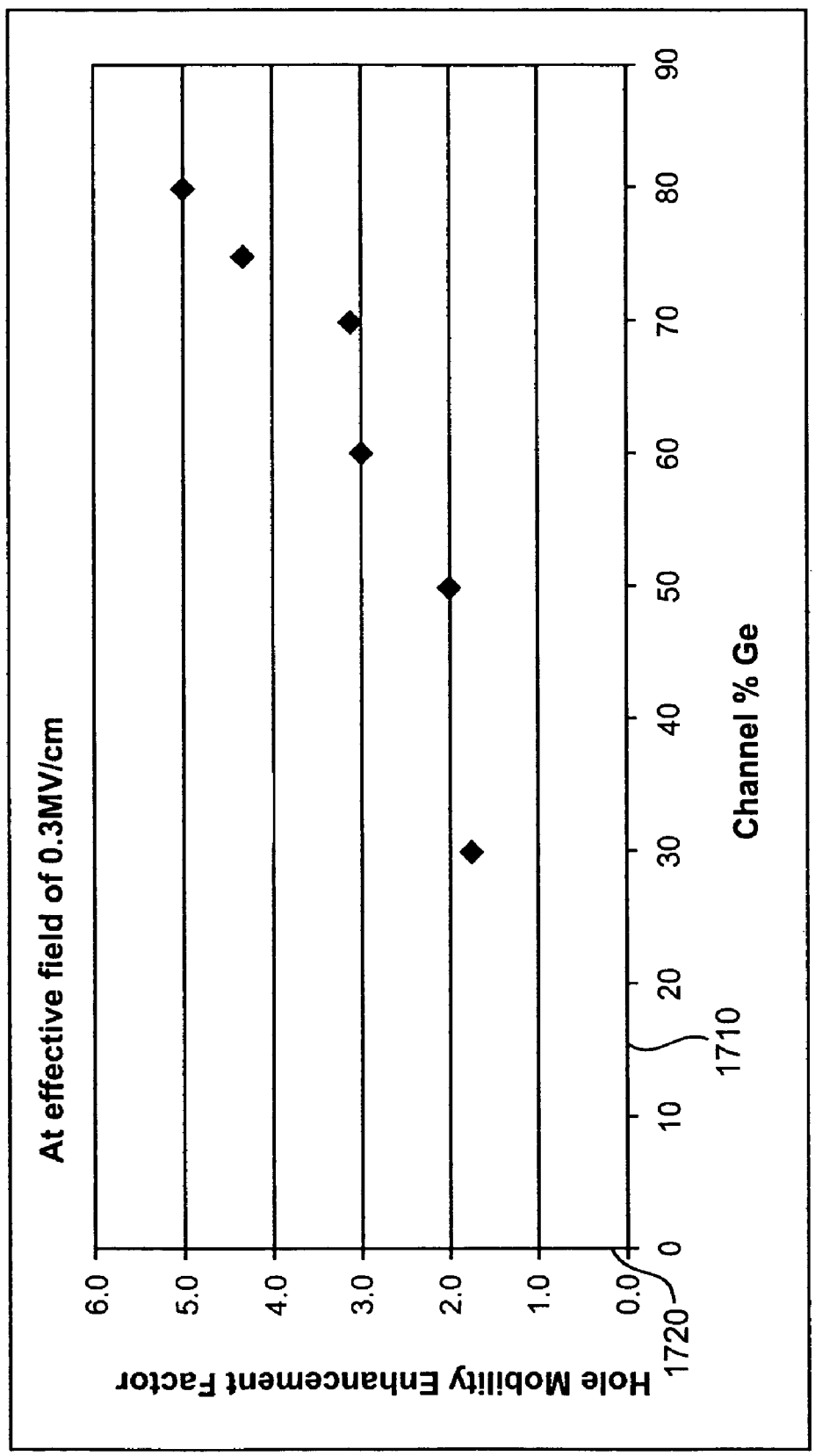
FIG. 17 illustrates a change in mobility as a function of germanium concentration in a channel region.

FIG. 17 illustrates a change in mobility as a function of germanium concentration in a channel region. For example, a mobility enhancement of a factor of two is observed in $Si_{1-x}Ge_x$ film with a germanium concentration of 50 at %. Thus, the device using $Si_{50}Ge_{50}$ as channel possesses a channel resistance only half of that of the same device using bulk silicon. This mobility enhancement also significantly improves sub-threshold characteristics, which is important for low voltage applications.

FIG. 18 illustrates a valence band offset for a p-channel trench-gate power MOSFET having a SiGe channel region according to an embodiment of the present invention. This offset equals:

$$\Delta E_V \cong 0.65x - 0.22x^2$$

where x is the germanium content in the film. This offset helps to confine the holes in the strained $Si_{1-x}Ge_x$ channel. The parasitic channel resistance from silicon cap layer is then minimized.

Figure 19A:
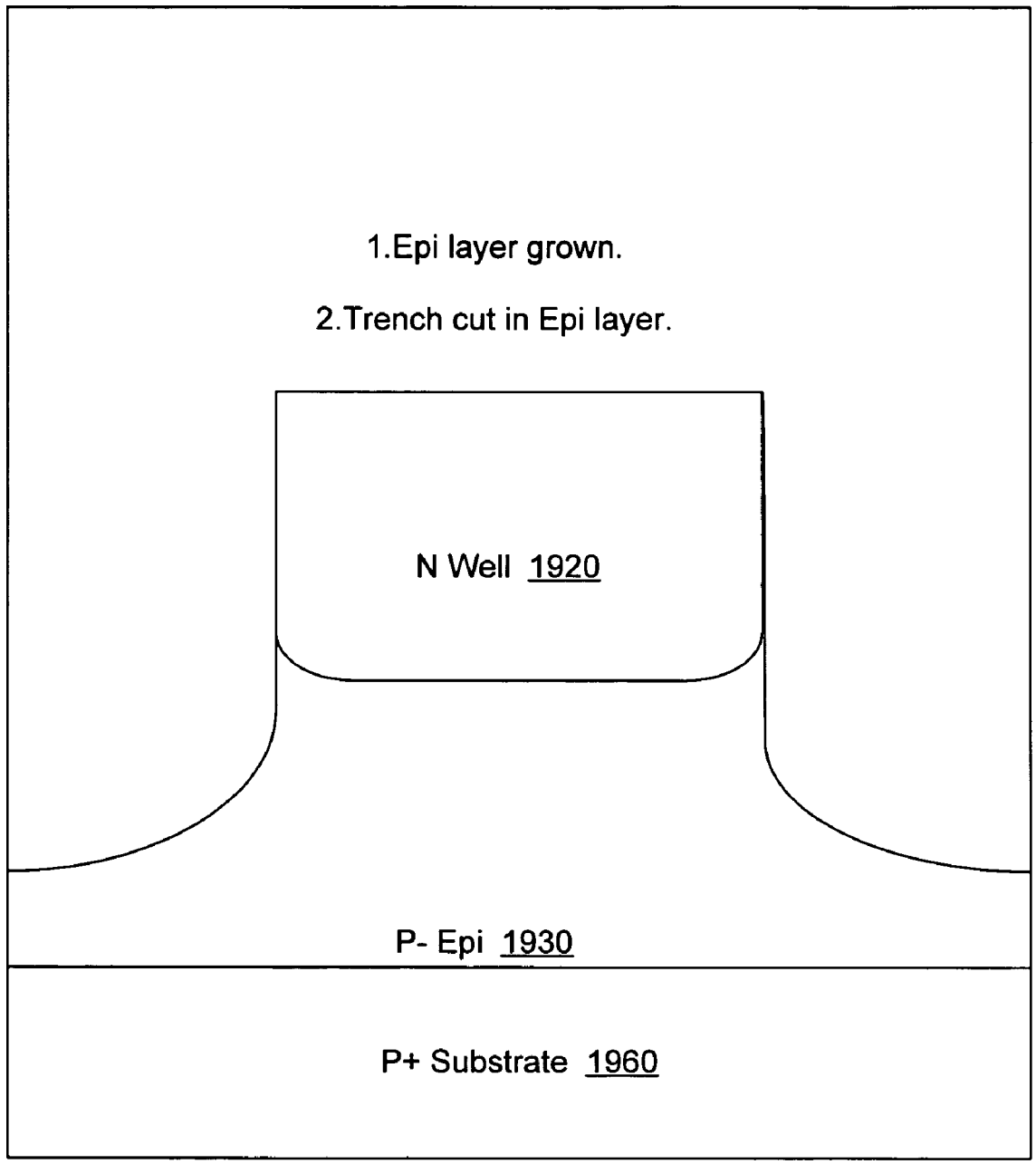
FIGS. 19A-19C illustrate a method of manufacturing a p-channel trench-gate power MOSFET having a SiGe channel region according to an embodiment of the present invention.
Figure 19B:
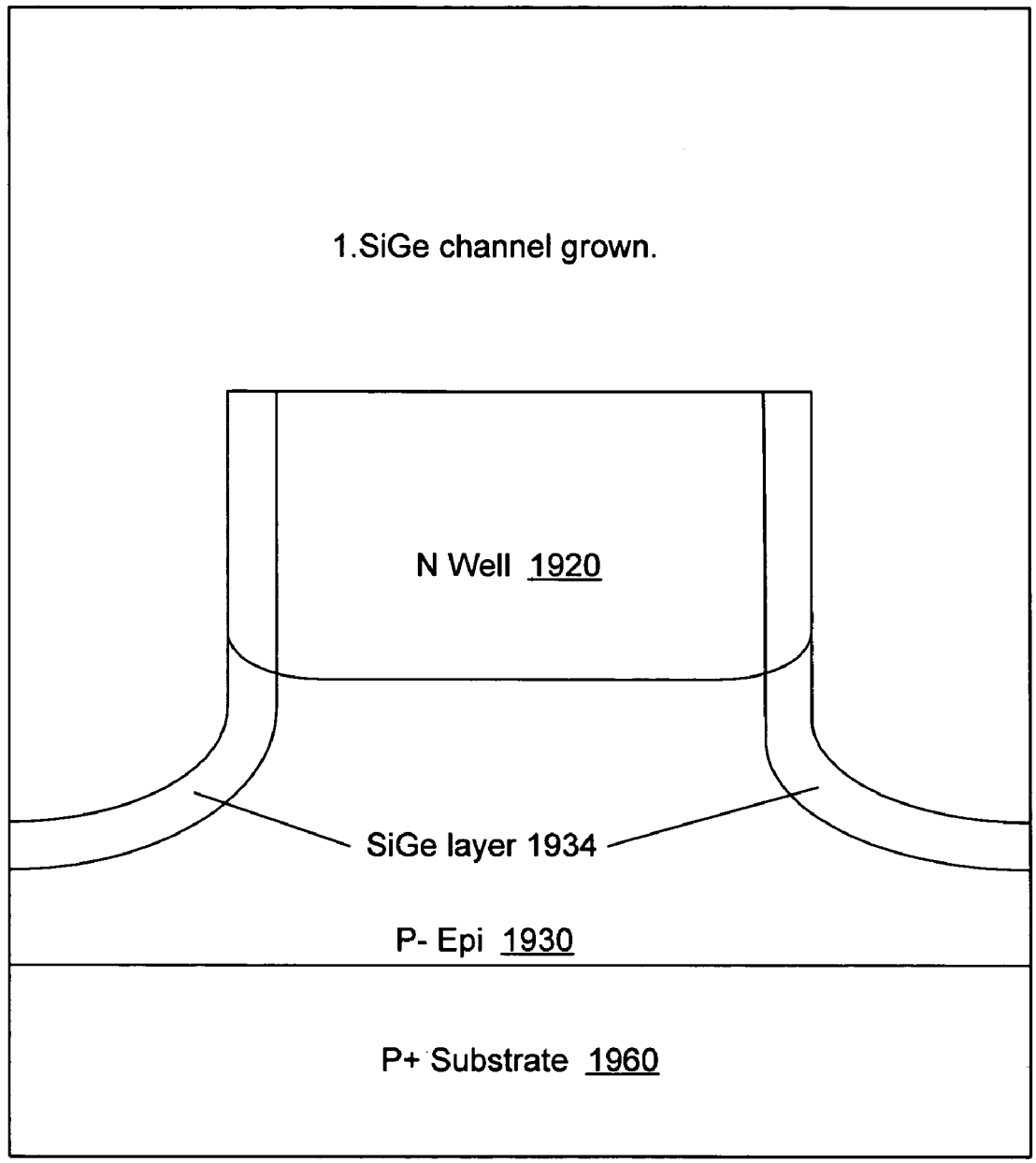
Figure 19C:
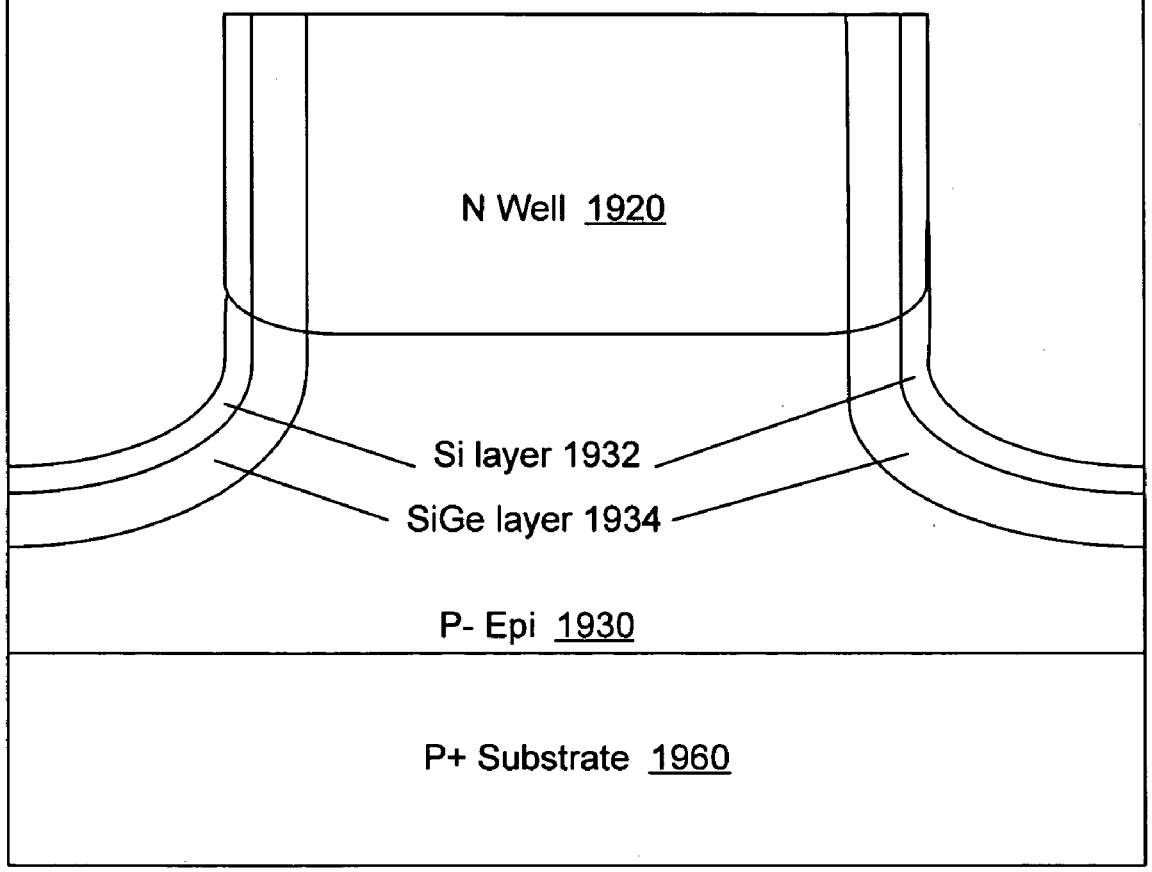

FIGS. 19A-19C illustrate a method of manufacturing a p-channel trench-gate power MOSFET having a SiGe channel region according to an embodiment of the present invention. In FIG. 19A, a silicon epitaxial layer 1930 is deposited or grown on a silicon substrate 1960. A trench is then formed. At some point, a well 1920 is implanted, or grown as part of the epi layer 1930.

In FIG. 19B, an epitaxial $Si_{1-x}Ge_x$ layer 1934 is deposited, grown, or implanted along the sidewall of trench. The $Si_{1-x}Ge_x$ layer's thickness ranges from 1 nm to 100 nm, depending on the germanium concentration. In one embodiment, the germanium concentration ranges from 10 at % through 80 at %. In other embodiments the germanium concentration may be different, for example it may be less than 10 percent by mole fraction, or more than 80 percent by mole fraction. In other embodiments, the range of germanium concentration may be less.

In FIG. 19C, a silicon cap layer 1932 is grown as an epitaxial layer on the top of $Si_{1-x}Ge_x$ layer 1934. In one embodiment, the thickness of the silicon cap layer 640 ranges from 1 nm to 10 nm, though in other embodiments it may be thinner or thicker than this range. Alternately, the silicon layer 1932 may remain after SiGe layer 1934 is implanted through it.

Figure 20:
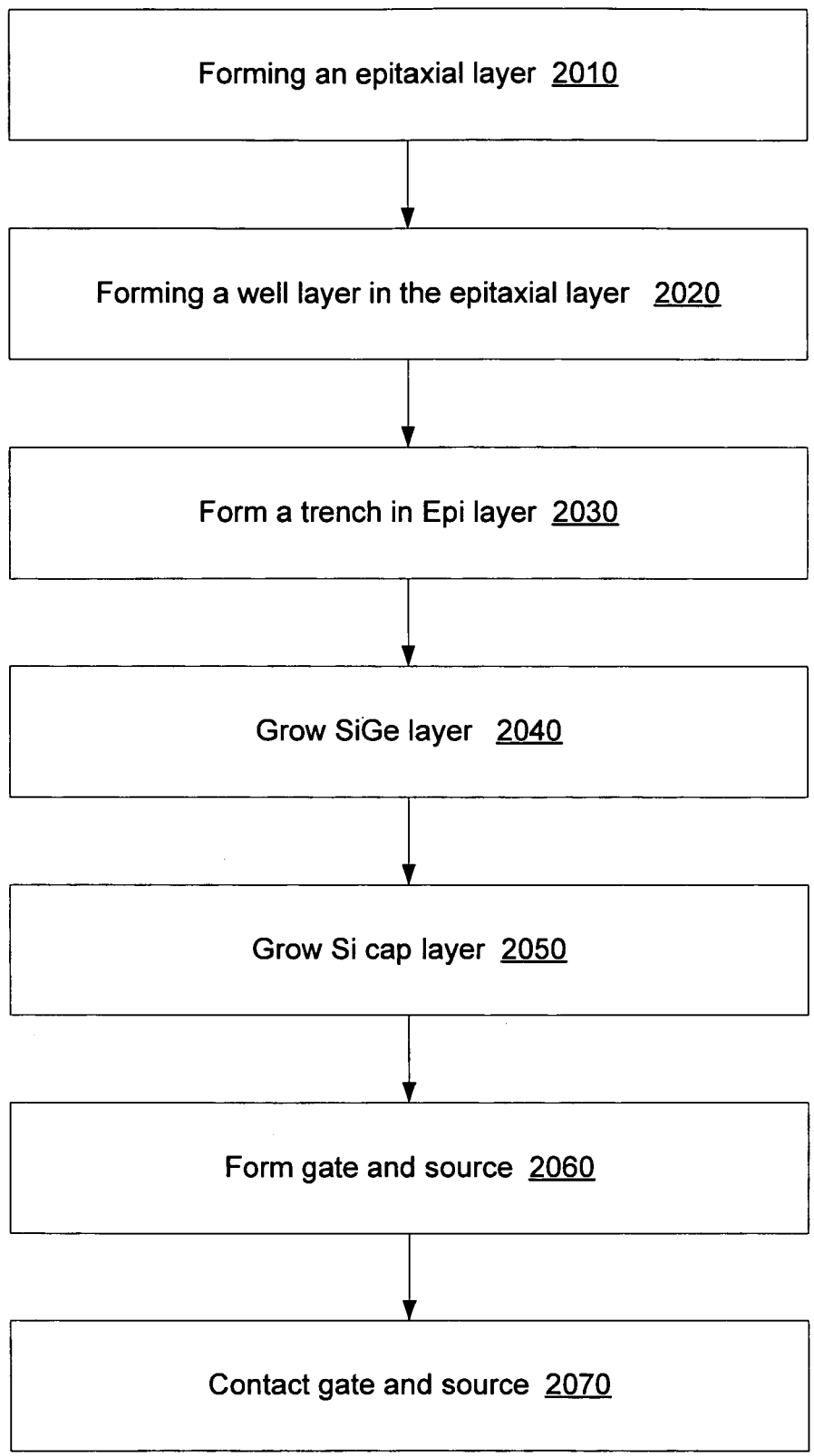
FIG. 20 is a flowchart of a method of manufacturing a p-channel trench-gate power MOSFET having a SiGe channel region according to an embodiment of the present invention.

FIG. 20 is a flowchart of a method of manufacturing a p-channel trench-gate power MOSFET having a SiGe channel region according to an embodiment of the present invention. In this embodiment, a SiGe layer is grown in the channel region of a trench-gate power MOSFET device.

Specifically, in act 2010 an epitaxial layer is formed. In act 2020, a well layer is formed. A trench is then etched in the epi layer in act 2030. A SiGe layer is grown in act 2040, and in act 2050 a silicon cap is grown. Gate and source regions are formed and contacted in acts 2060 and 2070.

It will be appreciated by one skilled in the art that this and the other included flowcharts are highly simplified and illustrate only a few fundamental acts in the manufacturing process. Variations of the processes that may be improved by incorporating an embodiment of the present invention are myriad and not required for an understanding of the present invention.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. For example, it is understood that the doping polarities of the structures shown and described could be reversed and/or the doping concentrations of the various elements could be altered without departing from the invention. As another example, the present invention is shown and described in the context of a vertical MOSFET embodiment, but various embodiments of the present invention can be similarly implemented in other trenched gate structures such as trenched gate IGBTs, lateral trenched-gate MOSFETs, as well as vertical and lateral planar-gate MOSFETs and IGBTs. Also, the various transistor embodiments can be laid out using the well known open-cell or closed-cell configurations.

What is claimed is:

1. An MOS-gated transistor comprising:
a body region adjacent to a trench;
a source region adjacent to the trench and forming a first pn junction with the body region;
a drain region adjacent to the trench and forming a second pn junction with the body region;
a first layer of conductive material vertically extending along a side wall of the trench and being adjacent to at least a portion of the body region, wherein:
the first layer has a lower energy gap than the drain region, and
the first layer also extends through the source region;
a channel region including at least a portion of the first layer; and
a gate extending in the trench between the source region and the drain region.

2. The transistor of claim 1 wherein the channel region is insulated from the gate by a gate dielectric.

3. The transistor of claim 2 wherein the first layer comprises a silicon-germanium layer.

4. The transistor of claim 2 wherein the channel region comprises a layer of $Si_{1-x}Ge_x$ where $0.1<x<0.8$.

5. The transistor of claim 3 where the silicon-germanium layer comprises approximately between 10 and 80 percent germanium mole fraction.

6. The transistor of claim 2 wherein the channel region further includes a silicon cap layer extending between the first layer and the gate dielectric.

7. An MOS transistor comprising:
a trench;
a source region adjacent to the trench and forming a first pn junction with a body region;
a drain region adjacent to the trench and forming a second pn junction with the body region;
a gate extending in the trench between the source region and the drain region;
a silicon germanium layer extending along a sidewall of the trench between the gate and being adjacent to at least a portion of the body region, the silicon-germanium layer also extending through the source region; and
wherein:
at least a portion of the silicon-germanium layer forms a channel region of the MOS transistor.

8. The transistor of claim 7 wherein the channel region is insulated from the gate by a gate dielectric.

9. The transistor of claim 7 wherein the channel region comprises a layer of $Si_{1-x}Ge_x$ where $0.1<x<0.8$.

10. The transistor of claim 7 where the silicon-germanium layer comprises approximately between 10 and 80 percent germanium mole fraction.

11. The transistor of claim 7 wherein the channel region further includes a silicon cap layer extending between the silicon-germanium layer and the gate dielectric.

12. The transistor of claim 7 wherein the body region comprises a silicon region.

13. An MOS transistor comprising:
a trench;
a source region adjacent to the trench and forming a first pn junction with a body region;
a drain region adjacent to the trench and forming a second pn junction with the body region;
a silicon-germanium layer extending along a sidewall of the trench and also extending through the source region;
a channel region extending along the sidewall of the trench and adjacent to the body region, the channel region including a portion of the silicon-germanium layer;
a gate extending in the trench between the source region and the drain region;
a gate dielectric between the gate and the channel region; and
a silicon cap layer extending between the silicon-germanium layer and the gate dielectric.

14. The transistor of claim 13 wherein the body region comprises a silicon region.

15. The transistor of claim 13 wherein the channel region comprises a layer of $Si_{1-x}Ge_x$ where $0.1<x<0.8$.

16. The transistor of claim 13 where the silicon-germanium layer comprises approximately between 10 and 80 percent germanium mole fraction.

17. An MOS-gated transistor comprising:
a body region adjacent to a trench;
a source region adjacent to the trench and forming a first pn junction with the body region;
a drain region adjacent to the trench and forming a second pn junction with the body region;
a first layer of conductive material vertically extending along a side wall of the trench and being adjacent to at least a portion of the drain region, wherein:
the first layer has a lower energy gap than the body region; and
the first layer also extends to at least a portion of the trench bottom;
a channel region including at least a portion of the first layer; and
a gate extending in the trench between the source region and the drain region.

18. The transistor of claim 17 wherein body region comprises a silicon region.

19. The transistor of claim 17 wherein the first layer comprises a silicon-germanium layer.

20. The transistor of claim 17 wherein the channel region further includes a silicon cap layer extending between the first layer and a gate dielectric.

* * * * *